(12) United States Patent
Erdogan et al.

(10) Patent No.: US 7,076,514 B2
(45) Date of Patent: Jul. 11, 2006

(54) METHOD AND SYSTEM FOR COMPUTING PRE-EQUALIZER COEFFICIENTS

(75) Inventors: Alper Tunga Erdogan, Kucukesat (TR); Bijit Halder, Santa Clara, CA (US); Tzu-Hsien Sang, Chia-Yi (TW)

(73) Assignee: Conexant, Inc., Red Bank, NJ (US)

( * ) Notice: Subject to any disclaimer, the term of this patent is extended or adjusted under 35 U.S.C. 154(b) by 726 days.

(21) Appl. No.: 10/321,508

(22) Filed: Dec. 18, 2002

(65) Prior Publication Data

US 2003/0235245 A1 Dec. 25, 2003

Related U.S. Application Data

(60) Provisional application No. 60/340,246, filed on Dec. 18, 2001.

(51) Int. Cl.
*G06F 17/10* (2006.01)

(52) U.S. Cl. .................................................... 708/323
(58) Field of Classification Search ................. 708/323
See application file for complete search history.

(56) References Cited

U.S. PATENT DOCUMENTS

| | | | |
|---|---|---|---|
| 2,632,058 A | 3/1953 | Gray | |
| 4,245,345 A | 1/1981 | Gitlin et al. | |
| 4,285,061 A | 8/1981 | Ho | |
| 4,347,615 A | 8/1982 | Ash | |
| 4,416,015 A | 11/1983 | Gitlin | |
| 4,606,027 A | 8/1986 | Otani | |
| 4,890,298 A | 12/1989 | Galpin | |
| 5,220,570 A | 6/1993 | Lou et al. | |
| 5,333,149 A | 7/1994 | Vicard et al. | |
| 5,457,705 A | 10/1995 | Todoroki | |
| 5,502,736 A | 3/1996 | Todoroki | |
| 5,509,021 A | 4/1996 | Todoroki | |
| 5,586,144 A * | 12/1996 | Kahlman et al. | ........... 375/229 |
| 5,598,434 A | 1/1997 | Kaku et al. | |
| 5,636,244 A | 6/1997 | Goodson et al. | |
| 5,751,734 A | 5/1998 | Choi et al. | |
| 5,796,756 A | 8/1998 | Choi et al. | |
| 5,838,729 A | 11/1998 | Hu et al. | |
| 5,896,372 A | 4/1999 | Auerbach et al. | |
| 5,928,378 A | 7/1999 | Choi | |
| 5,946,361 A | 8/1999 | Araki et al. | |
| 5,970,104 A | 10/1999 | Zhong et al. | |
| 5,986,598 A | 11/1999 | Mittel | |
| 5,995,562 A | 11/1999 | Koizumi | |
| 6,038,251 A | 3/2000 | Chen | |

(Continued)

OTHER PUBLICATIONS

ITU Standard G.991.2, "Single Pair High Speed Digital Subscriber Line (SHDSL) Transceivers" Feb. 2001.
David Falconer, et al., "Application of Fast Kalman Estimation to Adaptive Equalization," IEEE Trans. on Comm., COM-26, No. 10, pp. 1439-1446, Oct. 1978.

(Continued)

*Primary Examiner*—D. H. Malzahn
(74) *Attorney, Agent, or Firm*—Hunton & Williams LLP

(57) ABSTRACT

According to an embodiment of present invention, an algorithm for computing static pre-equalizer coefficients, comprises the steps of determining a length of algorithm iterations; calculating a feedforward coefficient vector associated with a feedforward equalizer; calculating a pre-equalizer coefficient vector associated with a pre-equalizer filter; and performing the steps of calculating for the length of the algorithm iterations; wherein a mean square of an error between an output sequence and a transmitted digital input sequence is minimized.

18 Claims, 19 Drawing Sheets

U.S. PATENT DOCUMENTS

| | | | |
|---|---|---|---|
| 6,055,268 | A | 4/2000 | Timm et al. |
| 6,069,879 | A | 5/2000 | Chatter |
| 6,112,232 | A | 8/2000 | Shahar et al. |
| 6,232,901 | B1 | 5/2001 | Abbey |
| 6,232,902 | B1 | 5/2001 | Wada |
| 6,292,124 | B1 | 9/2001 | Hanada et al. |
| 6,344,812 | B1 | 2/2002 | Takeda et al. |
| 6,369,730 | B1 | 4/2002 | Blanken et al. |
| 6,388,601 | B1 | 5/2002 | De Gouy et al. |
| 6,424,279 | B1 | 7/2002 | Kim et al. |
| 6,424,280 | B1 | 7/2002 | Sadkowski |
| 6,441,761 | B1 | 8/2002 | Viswanathan |
| 6,445,734 | B1 | 9/2002 | Chen et al. |
| 6,452,521 | B1 | 9/2002 | Wang et al. |
| 6,456,217 | B1 | 9/2002 | Esaki |
| 6,456,219 | B1 | 9/2002 | Schreiber et al. |
| 6,483,449 | B1 | 11/2002 | Gandolfi et al. |
| 6,489,913 | B1 | 12/2002 | Hansen et al. |
| 6,496,128 | B1 | 12/2002 | Wiesbauer et al. |
| 6,498,573 | B1 | 12/2002 | Laaser |
| 6,498,819 | B1 | 12/2002 | Martin |
| 6,515,605 | B1 | 2/2003 | Panasik et al. |
| 6,515,607 | B1 | 2/2003 | Liu et al. |
| 6,628,707 | B1 * | 9/2003 | Rafie et al. .......... 375/233 |

OTHER PUBLICATIONS

Richard D. Gitlin, et al., "Data Communications Principles," Chapter 8, p. 591, 1992.

J. Quilichi, "HDSL2 Drives Down The Deployment Cost For TI Service," http://www.chipcenter.com/networking/technote004.html, pp. 1-7, Mar. 2002.

M. Rode, "Draft For HDSL2 Standard", Committee T1—Telecommunications T1E1.4, pp. 1-15, Nov./Dec. 1998.

M. Tu, "A 512-State PAM TCM Code for HDSL2", T1E1.4 Standards Project (HDSL2), pp. 1-7, Sep. 1997.

P. Jackson, et al., "Literature Survey on HDSL2 Modem Modeling and Simulation", EE 382C: Embedded Software Systems, pp. 1-10, Mar. 1999.

J. Quilichi, "An HDSL2 Printer", pp. 1-18, 2002.

G.A. Zimmerman, "HDSL2 Tutorial: Spectral Compatibility and Real-World Performance Advances", PairGain Technologies pp. 1-12, Jun. 1998.

* cited by examiner

| SYSTEM TYPE | DATA BITS PER SYMBOL | CODED BITS PER SYMBOL | CONSTELLATION SIZE | DATA RATE WITH 1.5 Mb PSD | DATA RATE WITH 2.0 Mb PSD | DATA RATE WITH 2.312 Mb PSD |
|---|---|---|---|---|---|---|
| SHDSL | 3 | 4 | 16-PAM | 1.5 Mbps | 2.0 Mbps | 2.312 Mbps |
| RE-SHDSL | M=4 | 5 | 32-PAM | 2.0 Mbps | 2.67 Mbps | 3.08 Mbps |
| RE-SHDSL | M=5 | 6 | 64-PAM | 2.5 Mbps | 3.33 Mbps | 3.85 Mbps |
| RE-SHDSL | M=6 | 7 | 128-PAM | 3.0 Mbps | 4.0 Mbps | 4.62 Mbps |
| RE-SHDSL | M=7 | 8 | 256-PAM | 3.5 Mbps | 4.67 Mbps | 5.39 Mbps |

FIG. 1a

| MAPPER-IN ($x_7:x_1$) | OUTPUT LEVEL | OUTPUT (HEX) | MAPPER-IN ($x_7:x_1$) | OUTPUT LEVEL | OUTPUT (HEX) |
|---|---|---|---|---|---|
| 0000000 | -127/128 | 8100 | 0000001 | -125/128 | 8300 |
| 0000010 | -123/128 | 8500 | 0000011 | -121/128 | 8700 |
| 0000100 | -119/128 | 8900 | 0000101 | -117/128 | 8B00 |
| 0000110 | -115/128 | 8D00 | 0000111 | -113/128 | 8F00 |
| 0001000 | -111/128 | 9100 | 0001001 | -109/128 | 9300 |
| 0001010 | -107/128 | 9500 | 0001011 | -105/128 | 9700 |
| 0001100 | -103/128 | 9900 | 0001101 | -101/128 | 9B00 |
| 0001110 | -99/128 | 9D00 | 0001111 | -97/128 | 9F00 |
| 0010000 | -95/128 | A100 | 0010001 | -93/128 | A300 |
| 0010010 | -91/128 | A500 | 0010011 | -89/128 | A700 |
| 0010100 | -87/128 | A900 | 0010101 | -85/128 | AB00 |
| 0010110 | -83/128 | AD00 | 0010111 | -81/128 | AF00 |
| 0011000 | -79/128 | B100 | 0011001 | -77/128 | B300 |
| 0011010 | -75/128 | B500 | 0011011 | -73/128 | B700 |
| 0011100 | -71/128 | B900 | 0011101 | -69/128 | BB00 |
| 0011110 | -67/128 | BD00 | 0011111 | -65/128 | BF00 |
| 0100000 | -63/128 | C100 | 0100001 | -61/128 | C300 |
| 0100010 | -59/128 | C500 | 0100011 | -57/128 | C700 |
| 0100100 | -55/128 | C900 | 0100101 | -53/128 | CB00 |
| 0100110 | -51/128 | CD00 | 0100111 | -49/128 | CF00 |
| 0101000 | -47/128 | D100 | 0101001 | -45/128 | D300 |
| 0101010 | -43/128 | D500 | 0101011 | -41/128 | D700 |
| 0101100 | -39/128 | D900 | 0101101 | -37/128 | DB00 |
| 0101110 | -35/128 | DD00 | 0101111 | -33/128 | DF00 |
| 0110000 | -31/128 | E100 | 0110001 | -29/128 | E300 |
| 0110010 | -27/128 | E500 | 0110011 | -25/128 | E700 |
| 0110100 | -23/128 | E900 | 0110101 | -21/128 | EB00 |
| 0110110 | -19/128 | ED00 | 0110111 | -17/128 | EF00 |
| 0111000 | -15/128 | F100 | 0111001 | -13/128 | F300 |
| 0111010 | -11/128 | F500 | 0111011 | -9/128 | F700 |
| 0111100 | -7/128 | F900 | 0111101 | -5/128 | FB00 |
| 0111110 | -3/128 | FD00 | 0111111 | -1/128 | FF00 |

FIG. 1b

| MAPPER-IN ($x_7:x_1$) | OUTPUT LEVEL | OUTPUT (HEX) | MAPPER-IN ($x_7:x_1$) | OUTPUT LEVEL | OUTPUT (HEX) |
|---|---|---|---|---|---|
| 1000000 | 1/128 | 0100 | 1000001 | 3/128 | 0300 |
| 1000010 | 5/128 | 0500 | 1000011 | 7/128 | 0700 |
| 1000100 | 9/128 | 0900 | 1000101 | 11/128 | 0B00 |
| 1000110 | 13/128 | 0D00 | 1000111 | 15/128 | 0F00 |
| 1001000 | 17/128 | 1100 | 1001001 | 19/128 | 1300 |
| 1001010 | 21/128 | 1500 | 1001011 | 23/128 | 1700 |
| 1001100 | 25/128 | 1900 | 1001101 | 27/128 | 1B00 |
| 1001110 | 29/128 | 1D00 | 1001111 | 31/128 | 1F00 |
| 1010000 | 33/128 | 2100 | 1010001 | 35/128 | 2300 |
| 1010010 | 37/128 | 2500 | 1010011 | 39/128 | 2700 |
| 1010100 | 41/128 | 2900 | 1010101 | 43/128 | 2B00 |
| 1010110 | 45/128 | 2D00 | 1010111 | 47/128 | 2F00 |
| 1011000 | 49/128 | 3100 | 1011001 | 51/128 | 3300 |
| 1011010 | 53/128 | 3500 | 1011011 | 55/128 | 3700 |
| 1011100 | 57/128 | 3900 | 1011101 | 59/128 | 3B00 |
| 1011110 | 61/128 | 3D00 | 1011111 | 63/128 | 3F00 |
| 1100000 | 65/128 | 4100 | 1100001 | 67/128 | 4300 |
| 1100010 | 69/128 | 4500 | 1100011 | 71/128 | 4700 |
| 1100100 | 73/128 | 4900 | 1100101 | 75/128 | 4B00 |
| 1100110 | 77/128 | 4D00 | 1100111 | 79/128 | 4F00 |
| 1101000 | 81/128 | 5100 | 1101001 | 83/128 | 5300 |
| 1101010 | 85/128 | 5500 | 1101011 | 87/128 | 5700 |
| 1101100 | 89/128 | 5900 | 1101101 | 91/128 | 5B00 |
| 1101110 | 93/128 | 5D00 | 1101111 | 95/128 | 5F00 |
| 1110000 | 97/128 | 6100 | 1110001 | 99/128 | 6300 |
| 1110010 | 101/128 | 6500 | 1110011 | 103/128 | 6700 |
| 1110100 | 105/128 | 6900 | 1110101 | 107/128 | 6B00 |
| 1110110 | 109/128 | 6D00 | 1110111 | 111/128 | 6F00 |
| 1111000 | 113/128 | 7100 | 1111001 | 115/128 | 7300 |
| 1111010 | 117/128 | 7500 | 1111011 | 119/128 | 7700 |
| 1111100 | 121/128 | 7900 | 1111101 | 123/128 | 7B00 |
| 1111110 | 125/128 | 7D00 | 1111111 | 127/128 | 7F00 |

FIG. 1c

| $b_n$ | 2 | 3 | 4 | 5 | ... | EVEN NUMBER | ODD NUMBER (>3) |
|---|---|---|---|---|---|---|---|
| $e_n(b_n)$ | $3\alpha_n$ | $9\alpha_n$ | $15\alpha_n$ | $30\alpha_n$ | ... | $(2^{b_n}-1)\alpha_n$ | $(2^{b_n} \times 31/32 - 1)\alpha_n$ |

FIG. 14

METHOD AND SYSTEM FOR COMPUTING PRE-EQUALIZER COEFFICIENTS

CROSS REFERENCE TO RELATED APPLICATIONS

This application claims priority from provisional application Ser. No. 60/340,246, filed Dec. 18, 2001, which is incorporated by reference.

FIELD OF THE INVENTION

The present invention relates generally to pre-equalizers, more particularly, an iterative approach for the computation of pre-equalizer coefficients.

BACKGROUND OF THE INVENTION

The advent of the Internet and the widespread popularity of personal computers have created an unprecedented demand for high bandwidth networks. Generally, Internet applications, from simple email to real time video conferencing, from web surfing to interactive movies, from interactive games to virtual TV stations, from online trading to online gambling, demand a higher bandwidth communication network. A fundamental challenge for the communication industry is to provide a reliable and affordable high bandwidth communication link to all types of Internet users. Various competing wire-line, wireless, and optical broadband technologies are deployed to partially meet the ever-increasing demand for higher bandwidth. The fastest growing broadband technology is the Digital Subscriber Line (DSL) technology, which provides a high bandwidth always-on connection over standard twisted pair copper media of the conventional telephone network. Among other wire-line media, coaxial cables are capable of providing always-on connections, however, its presence is insignificant compared to millions and millions of wired telephone customers who are connected by a twisted pair of copper wires. Other technologies, such as satellite, wireless, and optical, either provide limited coverage, limited bandwidth, or are too expensive for deployment to individual customers. As a result, DSL technology is uniquely positioned to provide the broadband link between individual customer premise and the central office, the so-called last-mile of the high-bandwidth communication network.

DSL is the fastest growing among emerging broadband technologies for very good reasons. First of all, DSL utilizes the existing copper wire network infrastructure. Secondly, compared to the voice modems, such as V.34 and V.90, used in most personal computers that provide up to 56 kbps dial-up connection, DSL provides a high bandwidth always-on connection with typical connection speeds from 384 kbps to 6 Mbps. Moreover, DSL is affordable with easy installation, simple turn-up, and high service reliability. The successful deployment of DSL is capable of providing digital broadband connection to anyone with an analog telephone line.

DSL services have been standardized over time by regional organizations such as, American National Standard Institute (ANSI), European Telecommunication Standard Institute (ETSI), and by world telecommunication organization International Telecommunication Union (ITU). These DSL standards define data communication protocols to connect customer premise equipment (CPE) to the central office (CO) and to provide connections to various networks, such as DSL service providers, virtual private networks (VPN), or the Internet. Various forms of digital data (e.g., voice, video, and data) can be transported using DSL technology. For transport of voice, DSL equipment is connected to the public switched telephone network (PSTN). For transport of video and data, DSL equipment uses the Internet via an Internet service provider (ISP). Voice over DSL (VoDSL) is capable of providing computer-to-computer, computer-to-telephone, and telephone-to-telephone voice services using an integrated access device (IAD). Video over DSL includes transport of MPEG-1 or MPEG-2 files, video conferencing using Internet Protocol (IP) standard such as ITU H.323, WebCam, and video mail. In addition, DSL supports simple data transport, e.g., bearer services, for virtual private network (VPN), leased data line such as T1 and E1, Point-to-Point Protocol (PPP), Asynchronous transfer mode (ATM), and Internet Protocol (IP).

Like other communication technologies, DSL has gone though a major evolution over the last decade and a collection of technologies, commonly referred to as xDSL, are developed under the umbrella of DSL. One type of subscriber loop digital transmission technology involves an integrated services digital network (ISDN), which has replaced a significant portion of the analog phone lines in Europe and Japan. ISDN offers integrated voice and data services and connection speed up to 144 kbps. Due to the high cost of deployment, an alternative solution called integrated digital loop carrier (IDLC) has been deployed in United States. However, resulting data rates were considered inadequate for individual customers. As a result, advanced DSL technologies were developed, which include HDSL, SDSL, ADSL, HDSL2, SHDSL, and VDSL, all of which are capable of connection speed in excess of 1 Mbps. These advanced DSL technologies were developed to address different needs and application demands, while serving different market segments. For example, SHDSL is a symmetric service designed for long reach office applications with connection speed of 1.5 Mbps, whereas, VDSL is designed to provide a very high-speed asymmetric service for a short-range applications.

SHDSL is a wire line Digital Subscriber Line (DSL) transmission technology that is designed to accommodate the need for higher data rates in telecommunication access networks. In particular, SHDSL supports duplex transmission of symmetric data rates over mixed gauge two-wire twisted metallic pairs, as described in the International Telecommunication Union (ITU) standard G.992.1—"Asymmetric Digital Subscriber Line (ADSL) Transceivers", the body of which is incorporated herein by reference.

These and other drawbacks exist with current technologies.

SUMMARY OF THE INVENTION

Aspects of the present invention overcome the problems noted above, and realize additional advantages.

According to another aspect of an embodiment of the present invention, an iterative algorithm for computing pre-equalizer coefficients is provided. A pre-equalizer is a non-adaptive filter that precedes an adaptive equalizer filter. A purpose of the pre-equalizer is to counteract against fixed components of a communication channel. According to an embodiment of the present invention, the algorithm may be used to compute the pre-equalizer coefficients where the algorithm implements an optimization criterion defined as a worst case mean square error minimization.

According to an embodiment of the present invention, an algorithm for computing static pre-equalizer coefficients, comprises the steps of determining a length of algorithm iterations; calculating a feedforward coefficient vector associated with a feedforward equalizer; calculating a pre-equalizer coefficient vector associated with a pre-equalizer filter; and performing the steps of calculating for the length of the algorithm iterations; wherein a mean square of an error between an output sequence and a transmitted digital input sequence is minimized.

In accordance with additional aspects of this exemplary embodiment, the feedforward equalizer is adaptive; the pre-equalizer filter is non-adaptive; the pre-equalizer coefficient vector comprises even-indexed pre-equalizer filter coefficients $\{p_{e,l}, l \in \{0, \ldots, N_P-1\}\}$ where $p_{e,l}=p_{2l} l \in \{0, \ldots, N_P-1\}$ where $N_P$ represents half a pre-equalizer length; the pre-equalizer coefficient vector comprises odd-indexed pre-equalizer filter coefficients $\{p_{o,l}, l \in \{0, \ldots, N_P-1\}\}$ where $p_{o,l}=p_{2l+1} l \in \{0, \ldots, N_P-1\}$; the feedforward coefficient vector comprises even feedforward filter coefficients in the $i^{th}$ test case, where $f_{e,k}^{(i)}=f_{2k}^{(i)} k \in \{0, \ldots, N_F-1\}$ where $N_F$ represents half a feedforward equalizer length; the feedforward coefficient vector comprises odd feedforward filter coefficients in the $i^{th}$ test case, where $f_{o,k}^{(i)}=f_{2k+1}^{(i)} k \in \{0, \ldots, N_F-1\}$; the step of calculating a feedforward coefficient vector further comprises calculating a convolution matrix for a noise shaping filter; the pre-equalizer filter increases an effective equalizer length without increasing a number of taps to be trained; the pre-equalizer filter receives an input sequence comprising a combination of a noise sequence from a noise shaping filter and an output of a channel; the channel models a linear distortion; the channel models a linear time invariant filter; the input sequence is received at an upsampling block for generating an upsampled signal; the upsampled signal is received by a channel for generating a channel output and wherein the channel output is combined with a noise sequence for being received by the pre-equalizer filter; the output sequence is produced by a feedback equalizer; the feedback equalizer filter is adaptive; the feedback equalizer filter processes at least one previous decision generated by a decision unit; and the output sequence is generated in part by a downsampled output of the feedforward equalizer.

The accompanying drawings, which are incorporated in and constitute a part of this specification, illustrate various embodiments of the invention and, together with the description, serve to explain the principles of the invention.

BRIEF DESCRIPTION OF THE DRAWINGS

The present invention can be understood more completely by reading the following Detailed Description of the Invention, in conjunction with the accompanying drawings, in which:

FIG. 1a is a table illustrating enhanced data rates of RE-SHDSL as a function of number of data bits per symbol, according to an embodiment of the present invention.

FIG. 1b is a table illustrating a mapper definition, according to an embodiment of an aspect of the present invention.

FIG. 1c is a table illustrating a mapper definition, according to an embodiment of an aspect of the present invention.

FIG. 14 illustrates a table of number of bits and required power levels for incorporation into the bit loading algorithm, according to an embodiment of the present invention.

DETAILED DESCRIPTION OF THE INVENTION

Figure 2:
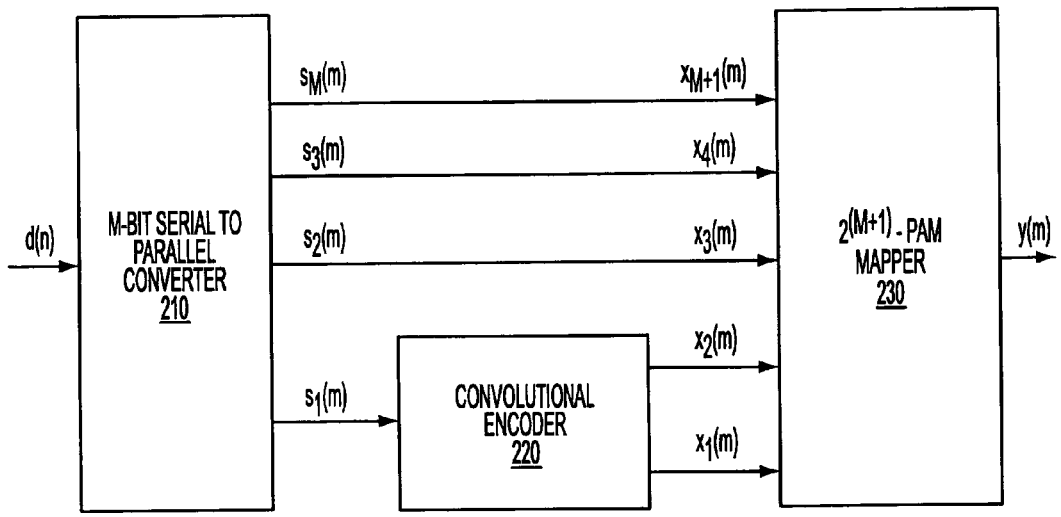
FIG. 2 illustrates a block diagram of TCM encoder for RE-G.SHDSL, according to an embodiment of an aspect of the present invention.

The following description is intended to convey a thorough understanding of the invention by providing a number of specific embodiments and details involving compliancy testing applications. It is understood, however, that the invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

The International Telecommunications Union (ITU) has adopted a standard for Single-pair High-speed Digital Subscriber Line (SHDSL) technology to address the need for higher data rates in telecommunication access networks. The ITU recommendations for SHDSL (e.g., G.992. 1) mandate the support of a wide range of data rates from 192 kilo bits per second (kbps) to 2.312 mega bits per second (Mbps).

There are applications, such as MDU/MTU, Ethernet and others, that may require or at least prefer a data rate beyond 2.312 Mbps. According to an aspect of an embodiment of the present invention, an efficient, easy to implement, and flexible method and system for increasing the data rate of the existing SHDSL transceivers is provided. The Rate-Enhanced (RE)-SHDSL of an embodiment of the present invention satisfies spectral compatibility requirements and is further transparent to other applications.

The RE-SHDSL of an embodiment of the present invention supports a variety of functions. RE-SHDSL is an efficient and easy to implement approach to increase the data rate of an existing SHDSL transceiver. Rate enhancement may be achieved by increasing the number of data bits per symbol thereby increasing signal constellations. The effective use of larger constellations is one difference between RE-SHDSL and SHDSL. The RE-SHDSL achieves a higher data rate without requiring additional transmit bandwidth or transmit power. The rate enhancement achieved by RE-SHDSL of an embodiment of the present invention is flexible compared to a four wire approach specified in the standard. As in SHDSL, RE-SHDSL may support a single pair wires. RE-SHDSL uses the same (or substantially similar) set of transmit masks as specified in SHDSL standard. As a result, there is no need for additional transmit masks. RE-SHDSL is compatible with four wire operations and may be used in a four wire mode (or other mode) to achieve an additional doubling of data rate. RE-SHDSL may be used for both region specific Annexes A and B of the ITU standard G.992.1 for SHDSL as well as other standards.

The RE-SHDSL system of an embodiment of the present invention does not require an additional pair of wires and provides a more flexible rate enhancement. Features of RE-SHDSL system include spectral compliance and transparency for successful deployment of any DSL as well as other technology. In other words, RE-SHDSL is fully compliant to spectral management requirements where the enhancements are transparent to other services deployed in the same binder, e.g., to any other service RE-SHDSL appears substantially the same as SHDSL. As a result, deployment of RE-SHDSL does not create additional crosstalk for other applications.

As specified in the ITU standard G.991.2, SHDSL transceivers may include a precoded system with Trellis Coded Pulse Amplitude Modulation (TC-PAM) line code. In particular, an encoder may be used to convert 3 data bits into 4 coded bits. The coded 4 bits may be converted into a symbol using a 16-PAM constellation mapper. For every 3 data bits, the SHDSL transceiver generates one symbol with a symbol rate $R_s$, which is one-third of the data rate $R_d$, e.g., $R_s=R_d/3$. The symbol rate is a system parameter that dictates the transmission bandwidth. Generally, the higher the symbol rate, the larger the required bandwidth. Hence, if the constellation size is fixed, a larger bandwidth may be used to support higher data rates. However, such an approach would violate spectral compatibility and would not be transparent to other applications.

In contrast to the SHDSL system where 3 data bits are used to form a symbol, RE-SHDSL of an embodiment of the present invention uses more then 3 data bits per symbol. The data rate may be increased by increasing a constellation size and allocating more bits per symbol while keeping the symbol rate fixed. Moreover, to simplify the transceiver design, the encoding scheme as described in SHDSL may be used with the exception that the number of uncoded bits are increased. An advantage of this approach is that there is no need to change signal processing blocks following the mapper. In other words, the change in number of bits per symbol and the consequent change in constellation size do not effect the signal processing operations that follow the mapper. In particular, the transmit filter and the transmit Power Spectral Density (PSD) remain identical (or substantially similar) to that of SHDSL.

With that in mind, M (>3) may represent the number of data bits used per symbol for RE-SHDSL, where the enhanced data rate $R_{ed}$ is given by $$R_{ed} = \frac{M}{3} R_d,$$

where $R_d$ represents the original data rate for SHDSL. Since M is larger than 3, the enhanced date rate $R_{ed}$ is larger than the original data rate $R_d$. The SHDSL system is capable of supporting data rates from 192 kbps up to 2.312 Mbps with an 8 kbps increment. For every supported data rate, there is a specific transmit mask defined in the standard G.992.1. The RE-SHDSL of an embodiment of the present invention uses the transmit mask corresponding to the particular SHDSL data rate from the specifications. As a result, RE-SHDSL is automatically spectrally compliant and transparent to other applications.

Typical exemplary values of M along with the corresponding enhanced date rates are shown in FIG. 1a. FIG. 1a is a table illustrating enhanced data rates of RE-SHDSL as a function of number of data bits per symbol according to an embodiment of the present invention. Column 110 provides a system type; column 112 provides data bits per symbol; column 114 provides coded bits per symbol; column 116 provides constellation size; column 118 provides data rate with 1.5 Mb PSD; column 120 provides data rate with 2.0 Mb PSD; and column 122 provides data rate with 2.312 Mb PSD. As shown in FIG. 1a, when M=4, a data rate of 3.08 Mbps may be achieved by implementing a constellation size of 32-PAM. The RE-SHDSL approach of an embodiment of the present invention is applicable to region specific Annexes A and B of the ITU standard G.992.1 for SHDSL, as well as other standards.

The frame structure of RE-SHDSL incorporates a payload size that is larger than that of SHDSL. In SHDSL standard, each payload block is defined as k bits long, where k=12 (i+8n) bits, and the corresponding payload rate is given by 64n+8i kbps. The parameters n and i are two integer defined by $3 \leq n \leq 36$ and $0 \leq i \leq 7$. For example, for n=36 and i=1, a payload rate is equal to 2.312 Mbps. For RE-SHDSL, the value of n is larger than 36. The exact range of n depends on the vale of M and is given by $3 \leq n \leq 12M$. For M=6 or double rate applications, the range of values for n is $3 \leq n \leq 72$.

FIG. 2 is a diagram of a Trellis Coded Modulation (TCM) Encoder, according to an embodiment of the present invention. For RE-SHDSL, more than 3 data bits are used to form a symbol y(m), as shown in FIG. 2. In this case, each M (>3) serial data bits, {d(n), d(n+1), d(n+2), . . . , d(n+M−1)} may be converted by converter 210 to an M bit parallel word {$s_1(m), s_2(m), s_3(m), \ldots, s_M(m)$}. The first bit $s_1(m)$ may be encoded using a convolutional encoder 220, such as a half rate convolutional encoder, to generate two encoded bits $x_1(m)$ and $x_2(m)$. The other M−1 bits $s_2(m), s_3(m), \ldots, s_M(m)$ may be essentially untouched and renamed $x_3(m), x_4(m), \ldots, x_{M+1}(m)$, as follows:

$$s_2(m) \rightarrow x_3(m)$$
$$s_3(m) \rightarrow x_4(m)$$
$$\vdots \qquad \vdots$$
$$s_M(m) \ldots x_{M+1}(m).$$

The M+1 bits $\{x_1(m), x_2(m), x_3(m), x_4(m) \ldots x_{M+1}(m)\}$ may then be used to form a symbol using a $2^{M+1}$-PAM constellation 230. Symbol to bit error may be minimized (e.g., by a Gray Code or other code) to simplify the decoder design where the bit labeled $x_1(m)$ represents a Least Significant Bit (LSB) and $x_{M+1}(m)$ represents a Most Significant Bit (MSB). Using the Gray (or other) code, the M+1 output bits may be mapped to $2^{M+1}$-PAM as described below. As $K=2^{M+1}$, the K normalized constellation points may be defined as $$\text{the } p\text{-th point} = \frac{(2p - K + 1)}{K} \quad p = 0, \ldots, K - 1,$$

where $$p = \sum_{l=1}^{M+1} 2^l x_l,$$

represents a decimal representation of the M+1 bits, where $x_1$ is the LSB. In other words, the M+1 bits $x_1, x_2, \ldots, x_{M+1}$ are mapped to the p-th normalized constellation point, e.g., $$x_1, x_2, \ldots, x_{M+1} \rightarrow \frac{(2p - K + 1)}{K}, \quad p = 0, \ldots, K - 1.$$

For example, if M=7, K=128 and the normalized 128 constellation points are represented as:

$$\frac{(2p - 127)}{128}, \quad p = 0, \ldots, 128.$$

For a fixed point implementation, the normalized constellation points may be represented using B binary bits in 2's complement form. The number of bits B may be larger than M+1 where the extra bits B−M−1 may determine the precision available for soft decision on the decoder and the overall performance of the Trellis Coded Modulation (TCM) scheme. For example, at least 8 extra bits may be provided for soft decision, e.g., B≧M+9.

An exemplary listing of 128-PAM points are shown in FIGS. 1b and 1c. FIG. 1b illustrates mapper definition for M=6 and a 128 PAM scenario. Column 130 indicates mapper-in, column 132 indicates output level; column 134 indicates output (HEX), column 136 indicates mapper-in; column 138 indicates output level and column 140 indicates output (HEX). FIG. 1c illustrates additional information for the M=6 and a 128 PAM scenario. Column 150 indicates mapper-in, column 152 indicates output level; column 154 indicates output (HEX), column 156 indicates mapper-in; column 158 indicates output level and column 160 indicates output (HEX). The binary representation of the output of the mapper may be given with B=16.

As mentioned above, there is generally no other signal processing requirement to support the larger constellation for RE-SHDSL of an embodiment of the present invention. In other words, following the mapper of FIG. 2 the signal processing for the RE-SHDSL is identical (or substantially similar) to that of the SHDSL. Hence, most or all the blocks that follow the TCM-mapper remain unchanged. In particular, the precoder, transmit filter, and analog front end do not require modification.

The ITU standard for SHDSL specifies transmit power spectral densities, e.g., transmit masks, for every supported rate from 192 kbps to 2.312 Mbps with 8 kbps increment. According to an embodiment of the present invention, the RE-SHDSL transmit signal uses one of the masks defined in SHDSL standard. The selection process for a transmit mask involves using an appropriate transmit mask corresponding to the SHDSL rate $R_d$. The enhanced data rate $R_{ed}$ is defined as $(M/3)R_d$ where $R_d$ is the original SHDSL rate and M is number of data bits per symbol. For each M, every enhanced data rate $R_{ed}$ corresponds to a SHDSL data rate $R_d$ and hence, a specific transmit mask. For an enhanced data rate $R_{ed}$, an embodiment of the present invention uses a transmit mask corresponding to the SHDSL rate $R_d$, thereby eliminating a need for any new transmit masks and guarantees spectral compatibility and transparency to other users.

According to another embodiment of the present invention, the RE-SHDSL receiver may include a deframer and a Trellis decoder. The deframer may provide added capacity for handling enhanced data rates. The Trellis decoder may be redesigned to handle a constellation size higher than 16-PAM. Additional bits added to the RE-SHDSL may be uncoded bits, which do not effect the convolutional coding. As a result, it is possible to design the Trellis decoder to accommodate higher constellations with minimal change. In addition, the Gray code used in the mapper definition may simplify the decoder design for higher constellations. One such implementation may include a situation where the major blocks of the decoder remain substantially same with minor changes to the input and output stages. Using such an implementation of the Trellis decoder, a SHDSL receiver may be modified to handle RE-SHDSL with minimal redesign effort.

For practical implementations, the constellation size cannot be increased without limit, e.g., the value of M cannot be too larger. Generally, for every additional bit, the signal to noise ratio (SNR) required at the receiver may increase by approximately 6 dB. For example, with M=6 the required SNR is about 43.5 dB as opposed to the 27.5 dB required for SHDSL.

Various modifications may be implemented for a standard SHDSL transceiver to incorporate RE-SHDSL functionality. RE-SHDSL frame structure has the ability to handle a higher payload rate or larger payload blocks. In particular, the maximum allowed value for the parameter n, that determines the payload rate and the payload block size, is 12M instead of 36 as specified in SHDSL. Note that M (>3) is the number of bits per symbol for the RE-SHDSL system.

The TCM-encoder may accommodate a larger number of uncoded bits as shown in FIG. 2. This effects the serial to parallel converter 210 and the mapper block 230 within the TCM-encoder. The Trellis decoder block in the receiver may accommodate higher size constellations. As pointed out, there are efficient implementations available that require minimal changes to the decoder block. In the exemplary case where M=4, a 4-bit serial to parallel converter and a 16-PAM mapper may be implemented where d(n) may be converted into a 4 bit word, which may include $s_1(m)$, $s_2(m)$, $s_3(m)$ and $s_4(m)$. Convolutional encoder 220 may receive first bit $s_1(m)$ and generate two bits $x_1(m)$ and $x_2(m)$. The 16-PAM mapper 230 may receive $x_1(m)$, $x_2(m)$, $x_3(m)$, $x_4(m)$ and $x_5(m)$ to generate $y(m)$.

RE-SHDSL of an embodiment of the present invention is an efficient and easy to implement approach for increasing the data rate of existing SHDSL transceivers. The rate enhancement may be achieved by increasing the number of data bits per symbol (M>3). Generally, the SHDSL standard specifies the use of 3 bits per symbol and 16-PAM constellation. In contrast, 4 or more bits per symbol and constellation size larger than 16-PAM are used in RE-SHDSL of an embodiment of the present invention. In addition, an embodiment of the present invention provides a method for effective use of larger constellations.

The RE-SHDSL of an embodiment of the present invention achieves a higher data rate without requiring any additional transmit bandwidth or transmit power. The rate enhancement achieved by RE-SHDSL of an embodiment of the present invention is flexible compared to the standard specified four wire approach. The rate enhancement may depend in part on the number of bits per symbol M. As in SHDSL, RE-SHDSL of an embodiment of the present invention may use a single pair of wire, at a minimum. RE-SHDSL uses the same (or substantially similar) set of transmit masks as specified in SHDSL standard. As a result, there is no need for additional transmit masks. RE-SHDSL satisfies spectral compatibility requirements and is transparent to other applications. Deployment of RE-SHDSL does not create additional crosstalk to other services. RE-SHDSL is further compatible with four wire operations as well as other modes. For example, RE-SHDSL may be used in a four wire mode to achieve an additional doubling of data rate. RE-SHDSL may be used for both region specific Annexes A and B of the ITU standard G.992.1 for SHDSL, as well as other standards.

According to another aspect of the present invention, an efficient iterative algorithm for the computation of pre-equalizer coefficients is provided. A pre-equalizer is a non-adaptive filter that precedes the adaptive equalizer filter. The pre-equalizer serves to counteract against fixed components of a communication channel. An algorithm of an embodiment of the present invention may be used to compute pre-equalizer coefficients in an optimal manner based on a worst case mean square error minimization.

A pre-equalizer may be considered a non-adaptive component of an overall equalizer structure. Linear distortion to be corrected by the equalization process may be partly caused by known transmit filter characteristics. This results in a common component for different channel scenarios where the use of a pre-equalizer block basically targets to exploit this fact. Viewing the functioning of a feedforward filter as a combination of signal to noise ratio (SNR) improvement through matched filtering and post-cursor inter symbol interference (ISI) correction motivates the use of a pre-equalizer to match the stationary component of the channel. This provides a greater degree of freedom for the feedforward equalizer to handle ISI.

A pre-equalizer block increases an effective equalizer length without increasing the number of taps to be trained. This provides potentially longer loops as the need for a longer equalizer increases with the increasing impulse response length of longer loops.

An increased equalizer length also improves SNR performance in noise cases by enhancing the ability to increase noise rejection and ISI compensation. This property is especially beneficial for cases where the SNR gap between an infinite length Decision Feedback Equalizer (DFE) and a finite impulse response (FIR) DFE equalizer is considerably large. Even in the cases where this gap is small, use of a pre-equalizer may provide enhanced whitening of an error spectrum and therefore an improved Bit Error Rate (BER) performance.

The use of a pre-equalizer may also increase the speed and performance of equalizer training, in particular, a blind section, by providing a pre-processing of the signal input to the equalizer.

Figure 3:
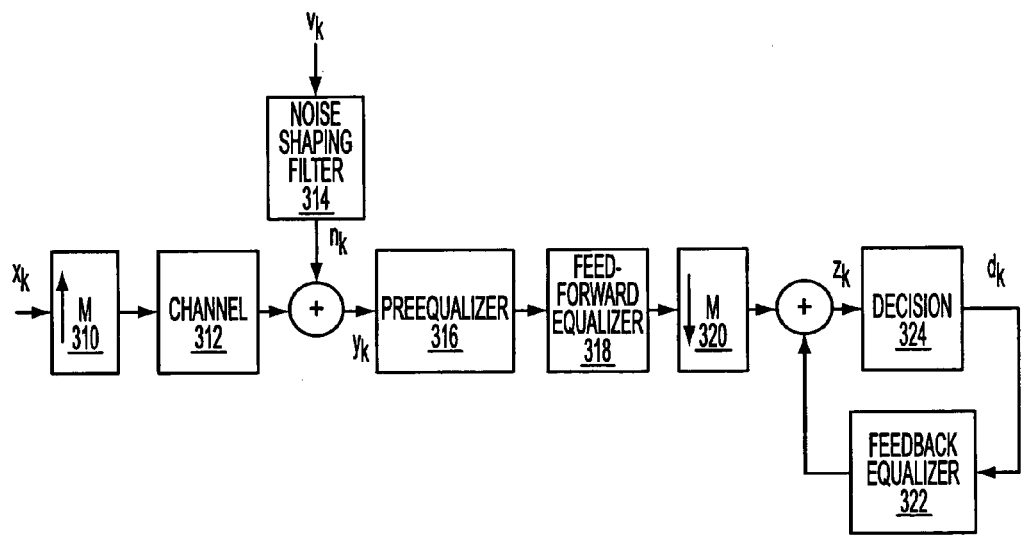
FIG. 3 illustrates a setup for fractionally spaced DFE with pre-equalizer, according to an embodiment of the present invention.

An embodiment of the present invention is directed to providing an algorithm for computing pre-equalizer coefficients. FIG. 3 illustrates an overall equalization model for a fractionally spaced Decision Feedback Equalizer (DFE) with an oversampling factor M that employs a pre-equalizer filter, according to an embodiment of the present invention.

Signal $x_k$ represents a transmitted digital input sequence that is received by upsampling block 310. Signal $x_k$ is upsampled by a factor M at 310, where upsampling may involve the insertion of M−1 zeros in between the samples of signal $x_k$. Other methods of upsampling may also be implemented. The upsampled signal is received by channel 312. Channel 312 models an overall linear distortion caused by a combination of a transmit filter, communication medium and/or a receive filter. Channel 312 may be modeled by a linear time invariant filter with coefficients $h_l$. An output of channel 312 may be corrupted by a noise sequence $n_k$ where $n_k$ is formed by passing a white noise sequence $v_k$ through a noise shaping filter 314 with an impulse response $g_k$.

Signal $y_k$ is an input sequence received by pre-equalizer 316 which may include a combination of an output of channel 312 and noise sequence $n_k$. The pre-equalizer 316 and decision feedback equalizer, which may include components such as feed-forward equalizer 318 and feedback equalizer 322, process signal $y_k$ to counteract against the effects of channel and noise.

Signal $y_k$ is first processed by a pre-equalizer filter 316 with impulse response $\{p_k; k \in \{0, \ldots, 2N_P-1\}\}$ where the pre-equalizer filter may be non-adaptive. The output of the pre-equalizer filter 316 is further filtered by a feed-forward equalizer 318 with coefficients $\{f_k; k \in \{0, \ldots, 2N_F-1\}\}$ where the feed-forward equalizer may be adaptive and then downsampled by a factor M by downsampling block 320. Downsampling may involve selecting one sample out of M consecutive samples.

The output of the downsampling unit 320 may be combined with an output of a feedback equalizer 322 to produce output sequence $z_k$ where the feedback equalizer 322 may be adaptive. The feedback equalizer processes the previous decisions where the feedback equalizer has coefficients $\{b_k; k \in \{0, \ldots, N_B-1\}\}$. Finally, the decision unit 324 uses $z_k$ to produce final decisions $d_k$.

Figure 4:
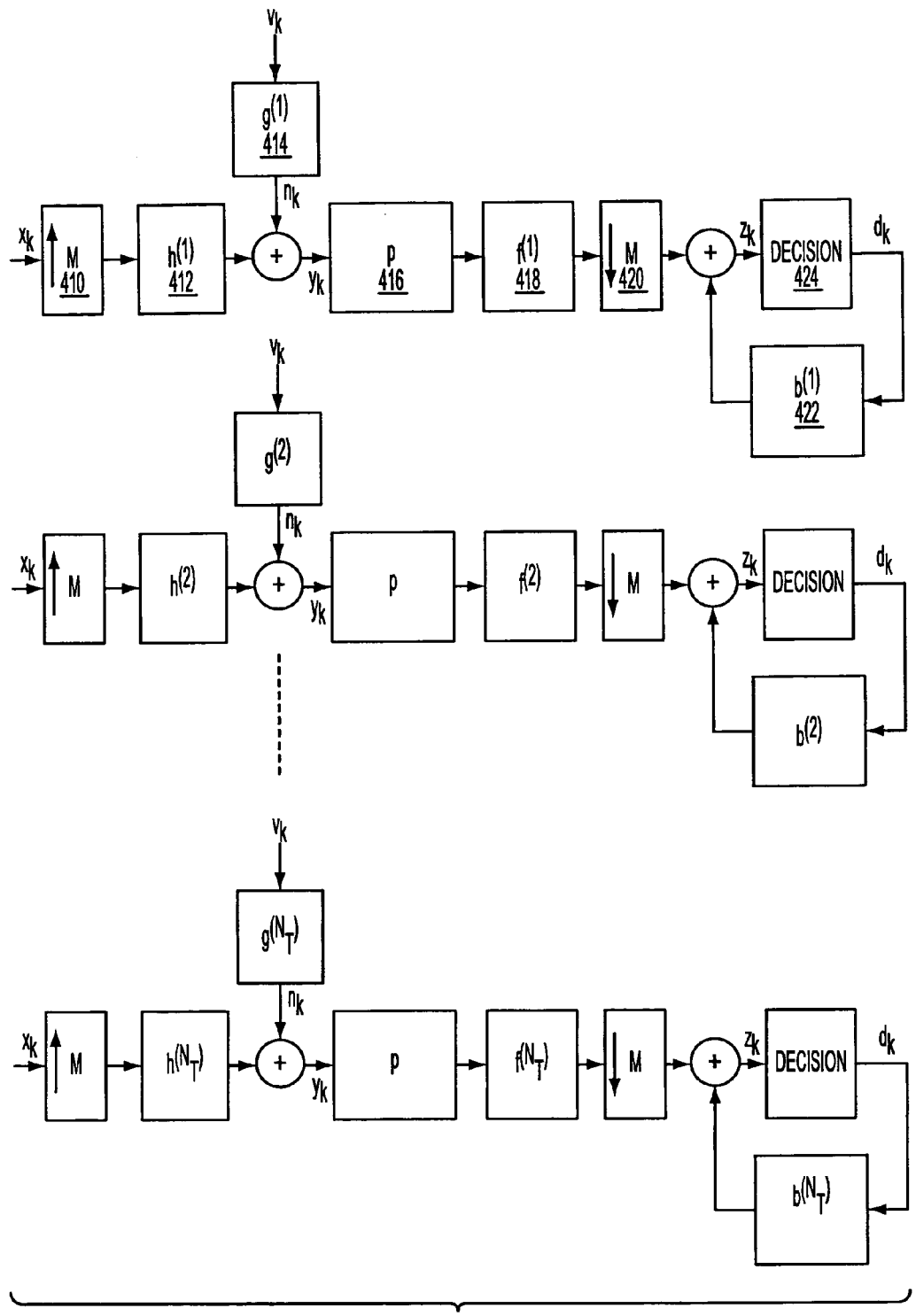
FIG. 4 illustrates a pre-equalizer design test case, according to an embodiment of the present invention.

According to an embodiment of the present invention, the algorithm performs the computation of the pre-equalizer coefficients for the structure, such as one illustrated in FIG. 3 where M=2. As shown in FIG. 4, there may exist $N_T$ test cases with corresponding channel impulse responses 412 ($\{h_l^{(i)}; l \in \{0, \ldots, N_C-1\}, i \in \{0, \ldots, N_T\}\}$) and noise shaping filters 414 ($\{g_k^{(i)}; k \in \{0, \ldots, N_G-1\}, i \in \{0, \ldots, N_G-1\}\}$) that may be targeted to optimize the pre-equalizer coefficients. As shown in FIG. 4, pre-equalizer coefficients 416 $\{p_k\}$ are kept fixed while the adaptive feedforward filter coefficients 418 $\{f_k^{(i)}\}$ and the adaptive feedback equalizer coefficients 422 $\{b_k^{(i)}\}$ may be different for each test case.

An embodiment of the present invention provides an algorithm for computing static pre-equalizer coefficients and minimizing the maximum value of the mean square of the error between $z_k$ and $x_k$ over a range of possible test cases.

Algorithm parameters may include predetermined constants independent of the data to be used in the algorithm. The following values may be adjusted to achieve different levels of performance.

| | |
|---|---|
| $N_P$: | Half Pre-equalizer Length. |
| $N_F$: | Half Feedforward Equalizer Length. |
| $N_B$: | Feedback Equalizer Length. |
| $N_I$: | Number of algorithm iterations. |
| $N_C$: | Half Channel Length. |
| $N_T$: | Number of test cases. |
| $\sigma^2_x$: | Transmit signal power. |
| $N_G$: | The length of noise shaping filter. |

$\{g_l^{(i)}, l \in \{0, \ldots, N_G-1\}\}$: The impulse response of a noise shaping filter for the $i^{th}$ test case.

$\{h_l^{(i)}, l \in \{0, \ldots, 2N_C-1\}\}$: The channel impulse response for the $i^{th}$ test case.

$\{h_{e,l}^{(i)}, l \in \{0, \ldots, N_C-1\}\}$: The even-indexed samples of a channel impulse response for the $i^{th}$ test case, where $$h_{e,l}^{(i)} = h_{2l}^{(i)} \; l \in \{0, \ldots, N_C-1\}$$

$\{h_{o,l}^{(i)}, l \in \{0, \ldots, N_C-1\}\}$: The odd-indexed samples of a channel impulse response for the $i^{th}$ test case, where $$h_{o,l}^{(i)} = h_{2l+1}^{(i)} \; l \in \{0, \ldots, N_C-1\}$$

The following provides descriptions of variables that may be used in an algorithm of an embodiment of the present invention.

$\{p_l, l \in \{0, \ldots, 2N_P-1\}\}$: The pre-equalizer filter coefficients.

$\{p_{e,l}, l \in \{0, \ldots, N_P-1\}\}$: The even-indexed pre-equalizer filter coefficients, where $$p_{e,l} = p_{2l} \; l \in \{0, \ldots, N_P-1\}.$$

$\{p_{o,l}, l \in \{0, \ldots, N_P-1\}\}$: The odd-indexed pre-equalizer filter coefficients, where $$p_{o,l} = p_{2l+1} \; l \in \{0, \ldots, N_P-1\}.$$

$p$:$(2N_P \times 1)$ pre-equalizer coefficient vector:

$$p = \begin{bmatrix} p_{e,0} \\ p_{e,1} \\ \vdots \\ p_{e,N_P-1} \\ p_{o,0} \\ p_{o,1} \\ \vdots \\ p_{o,N_P-1} \end{bmatrix}.$$

$\{f_k^{(i)}, k \in \{0, \ldots, 2N_F-1\}\}$: Feedforward filter coefficients in the $i^{th}$ test case.

$\{f_{e,k}^{(i)}, k \in \{0, \ldots, N_F-1\}\}$: Even feedforward filter coefficients in the $i^{th}$ test case, where $$f_{e,k}^{(i)} = f_{2k}^{(i)} \; k \in \{0, \ldots, N_F-1\}$$

$\{f_{o,k}^{(i)}, k \in \{0, \ldots, N_F-1\}\}$: Odd feedforward filter coefficients in the $i^{th}$ test case.

$$f_{o,k}^{(i)} = f_{2k+1}^{(i)} \; k \in \{0, \ldots, N_F-1\}$$

$f^{(i)}$: Feedforward coefficient vector in the $i^{th}$ test case:

$$f^{(i)} = \begin{bmatrix} f_{e,0}^{(i)} \\ f_{e,1}^{(i)} \\ \vdots \\ f_{e,N_F-1}^{(i)} \\ f_{o,0}^{(i)} \\ f_{o,1}^{(i)} \\ \vdots \\ f_{o,N_F-1}^{(i)} \end{bmatrix}.$$

$\{b_k^{(i)}, k \in \{0, \ldots, N_B-1\}\}$: Feedback coefficients in the $i^{th}$ test case.

$b(i)$: Feedback coefficient vector:

$$b^{(i)} = \begin{bmatrix} b_0^{(i)} \\ b_1^{(i)} \\ \vdots \\ b_{N_B-1}^{(i)} \end{bmatrix}.$$

$L_1^{(i)}$: scalar, length variable.
$L_2^{(i)}$: scalar, length variable.
$L_3^{(i)}$: scalar, length variable.
$L_d^{(i)}$: $(d^{(i)}+L_3^{(i)}+1 \times 1)$ Vector, intermediate variable.
$Q^{(i)}$: $(N_B+L_3^{(i)}-d^{(i)} \times N_T \times N_B)$ Matrix, intermediate variable.
$C_o^{(i)}$: $(N_F+N_P \times N_F+N_P+N_C-1)$ Matrix, odd channel convolution matrix.
$C_e^{(i)}$: $(N_F+N_P-1 \times N_F+N_P+N_C-2)$ Matrix, even channel convolution matrix.
$C^{(i)}$: $(2N_F+2N_P-1 \times L_3^{(i)})$ Matrix, intermediate variable.
$q^{(i)}$: $(1 \times 2N_P+N_B N_T)$ Vector, intermediate variable.
$Z^{(i)}$: $(2N_P+N_B N_T \times 2N_P+N_B N_T)$ Matrix, intermediate variable.
$A^{(i)}$: $((N_T N_B+2N_P) \times (N_T N_B+2N_P))$ Matrix, intermediate variable.
$t$: scalar, intermediate search variable used in optimization algorithm.
$G^{(i)}$: $(N_P+N_F-1 \times N_P+N_F+N_G-2)$ Matrix, convolution matrix for the noise shaping filter.
$M^{(i)}$: $(N_B \times L_1^{(i)})$ Matrix, intermediate variable.
$H_o^{(i)}$: $(N_F+N_P-1) \times N_F+N_P+N_C-2)$ Matrix, odd channel convolution matrix.
$H_e^{(i)}$: $(N_F+N_P-1) \times N_F+N_P+N_C-2)$ Matrix, even channel convolution matrix.
$H^{(i)}$: $(N_F+N_P-1 \times L_1^{(i)})$ Matrix, intermediate variable.
$P_o$: $(N_F \times N_F+N_P-1)$ Matrix, odd pre-equalizer convolution matrix.
$P_e$: $(N_F \times N_F+N_P-1)$ Matrix, even pre-equalizer convolution matrix.
$P_1$: $(N_F \times 2N_F+2N_P-1)$ Matrix, intermediate variable.
$P_2$: $(N_F \times 2N_F+2N_P-1)$ Matrix, intermediate variable.
$P$: $(2N_F \times 2N_F+2N_P-1)$ Matrix, intermediate variable.
$Rs_n^{-1} x_{n-d}^j$: $(2N_F+N_B \times 1)$ Matrix, cross correlation vector.
$Rs_n^{-1}$: $(2N_F+N_B \times 2N_F+N_B)$ Matrix, covariance matrix.

Figure 5:
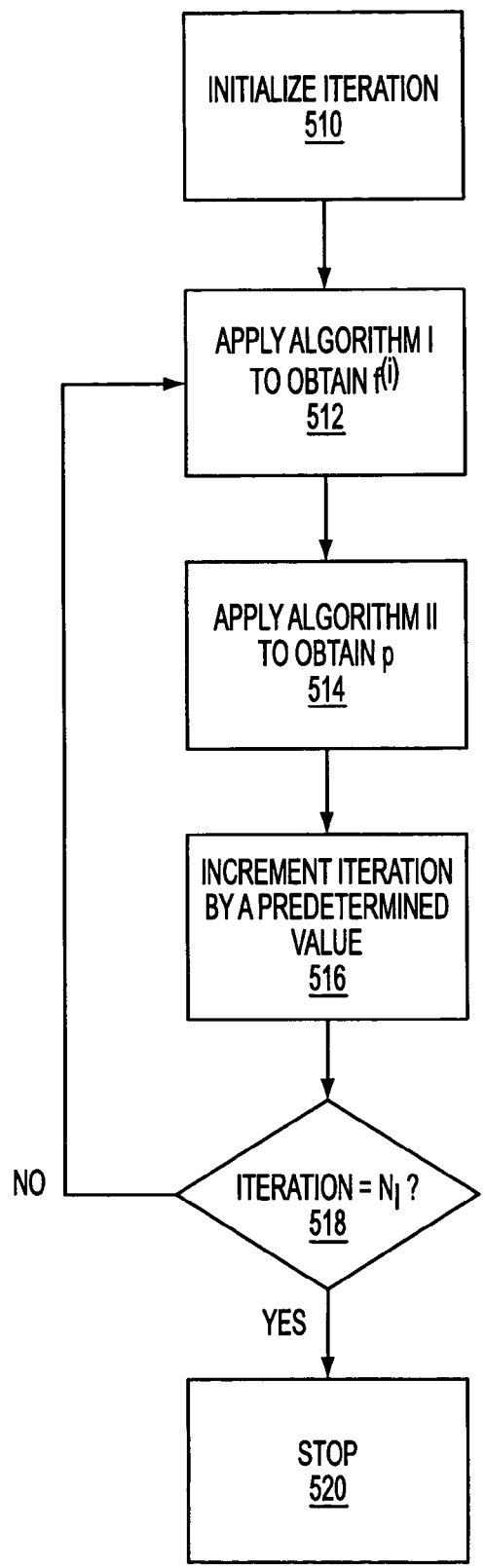
FIG. 5 is a flowchart illustrating of an algorithm for determining pre-equalizer coefficients, according to an embodiment of the present invention.

FIG. 5 illustrates a flowchart of an algorithm for determining pre-equalizer coefficients, according to an embodiment of the present invention. At step 510, iteration may be initialized to a predetermined value, such as 0. At step 512, Algorithm-I described below may be applied to obtain $f^{(i)}$ for all $i=1, \ldots, N_T$. At step 514, Algorithm-II described below may be applied to obtain p. At step 516, iteration may be incremented by a predetermined value, such as 1. For example, iteration may be set to iteration+1. At step 518, it may be determined whether iteration=$N_1$. If so, then stop at step 520 else go to step 512.

Algorithm-I

Step 1. Set $L_1^{(i)}$ as the maximum of the following 2 quantities:

$N_P+N_C+N_F-2$, $d^{(i)}+1+N_B$

Step 2. Set $L_2^{(i)}$ using the formula $L_2^{(i)}=L_1^{(i)}-N_C-N_F-N_P+1$,

Step 3. Form the $(N_P+N_F-1)\times(N_P+N_F+N_G-2)$ matrices $G^{(i)}$ for all i=1, . . . , $N_T$ using the formula $$G^{(i)} = \begin{bmatrix} 0 & g_0^{(i)} & g_1^{(i)} & g_2^{(i)} & \cdots & g_{N_G-2}^{(i)} & g_{N_G-1}^{(i)} & 0 & \cdots & 0 & 0 \\ 0 & 0 & 0 & g_0^{(i)} & \cdots & g_{N_G-4}^{(i)} & g_{N_G-3}^{(i)} & g_{N_G-2}^{(i)} & \cdots & 0 & 0 \\ \vdots & \ddots & \ddots & \ddots & \ddots & \ddots & \ddots & \ddots & \ddots & \ddots & \vdots \\ \cdots & \cdots & \cdots & \cdots & \cdots & \cdots & \cdots & \cdots & \cdots & g_{N_G-1}^{(i)} & 0 \\ g_0^{(i)} & g_1^{(i)} & g_2^{(i)} & g_3^{(i)} & \cdots & g_{N_G-1}^{(i)} & 0 & 0 & \cdots & 0 & 0 \\ 0 & 0 & g_0^{(i)} & g_1^{(i)} & \cdots & g_{N_G-3}^{(i)} & g_{N_G-2}^{(i)} & g_{N_G-1}^{(i)} & \cdots & 0 & 0 \\ \vdots & \ddots & \ddots & \ddots & \ddots & \ddots & \ddots & \ddots & \ddots & \ddots & \vdots \\ \cdots & \cdots & \cdots & \cdots & \cdots & \cdots & \cdots & \cdots & \cdots & g_{N_G-2}^{(i)} & g_{N_G-1}^{(i)} \end{bmatrix}.$$

Step 4. Form the $N_B\times L_1^{(i)}$ matrices $M^{(i)}$ for all i=1, . . . , $N_T$, using the formula $M^{(i)}=[0_{N_B\times d^{(i)}+1} I_{N_B} 0_{N_B\times L_1^{(i)}-d^{(i)}-1-N_B}]$.

Step 5. Form the $(N_F+N_P)\times(N_F+N_P+N_C-1)$ matrices $H_o^{(i)}$ for all i=1, . . . , $N_T$, using the formula $$H_o^{(i)} = \begin{bmatrix} h_{o,0}^{(i)} & h_{o,1}^{(i)} & h_{o,2}^{(i)} & \cdots & h_{o,N_C-1}^{(i)} & 0 & 0 & \cdots \\ 0 & h_{o,0}^{(i)} & h_{o,1}^{(i)} & \cdots & h_{o,N_C-2}^{(i)} & h_{o,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{o,N_C-1}^{(i)} \end{bmatrix}.$$

Step 6. Form the $(N_F+N_P-1)\times(N_F+N_P+N_C-1)$ matrices $H_e^{(i)}$ for all i=1, . . . , $N_T$, using the formula $$H_e^{(i)} = \begin{bmatrix} h_{e,0}^{(i)} & h_{e,1}^{(i)} & h_{e,2}^{(i)} & \cdots & h_{e,N_C-1}^{(i)} & 0 & 0 & \cdots & 0 \\ 0 & h_{e,0}^{(i)} & h_{e,1}^{(i)} & \cdots & h_{e,N_C-2}^{(i)} & h_{e,N_C-1}^{(i)} & 0 & \cdots & 0 \\ \vdots & \ddots & \ddots & \ddots & \ddots & \ddots & \ddots & \vdots & \vdots \\ 0 & 0 & 0 & \cdots & \cdots & \cdots & \cdots & h_{e,N_C-1}^{(i)} & 0 \end{bmatrix}.$$

Step 7. Form the matrices $H^{(i)}$ for all i=1, . . . , $N_T$, using the formula $$H^{(i)} = \begin{bmatrix} H_e^{(i)} & 0_{N_F+N_P-1\times L_2^{(i)}} \\ H_o^{(i)} & 0_{N_F+N_P\times L_2^{(i)}} \end{bmatrix}.$$

Step 8. Form the $N_F\times(N_F+N_P-1)$ matrix $P_o$ using the formula $$P_o = \begin{bmatrix} p_{o,0} & p_{o,1} & p_{o,2} & \cdots & p_{o,N_P-1} & 0 & 0 & \cdots \\ 0 & p_{o,0} & p_{o,1} & \cdots & p_{o,N_P-2} & p_{o,N_P-1} & 0 & \cdots \\ \vdots & \ddots & \ddots & \ddots & \ddots & \ddots & \ddots & \vdots \\ 0 & 0 & 0 & \cdots & \cdots & \cdots & \cdots & p_{o,N_P-1} \end{bmatrix}.$$

Step 9. Form the $N_F\times(N_F+N_P-1)$ matrix PP using the formula $$P_e = \begin{bmatrix} p_{e,0} & p_{e,1} & p_{e,2} & \cdots & p_{e,N_P-1} & 0 & 0 & \cdots \\ 0 & p_{e,0} & p_{e,1} & \cdots & p_{e,N_P-2} & p_{e,N_P-1} & 0 & \cdots \\ \vdots & \ddots & \ddots & \ddots & \ddots & \ddots & \ddots & \vdots \\ 0 & 0 & 0 & \cdots & \cdots & \cdots & \cdots & p_{e,N_P-1} \end{bmatrix}.$$

Step 10. Form the matrix $P_1$ using the formula $P_1=[P_e 0_{N_F\times 1} P_o]$.

Step 11. Form the matrix $P_2$ using the formula $P_2=[P_o P_e 0_{N_F\times 1}]$.

Step 12. Form the matrix P using the formula $$P = \begin{bmatrix} P_1 \\ P_2 \end{bmatrix},$$

Step 13. Finally compute $f^{(i)}$ for all i=1, . . . , $N_T$, using the formula $f^{(i)}=(P(H^{(i)}(I-M^{(i)}M^{(i)T})H^{(i)T}+G^{(i)}G^{(i)T})^{(i)}P^T)^{-1}PH^{(i)}$ Algorithm II Step 1. Set $L_3^{(i)}$ as the maximum of the below 2 quantities:

$d^{(i)}+N_B$ $N_P+N_F+N_C-1$

Step 2. Form the matrices $L_d^{(i)}$ for all i=1, . . . , $N_T$, using the formula $$L_d^{(i)} = \begin{bmatrix} 0_{d^{(i)}-1\times 1} \\ 2\sigma_X^2 \\ 0_{L_3^{(i)}-d^{(i)}\times 1} \end{bmatrix},$$

Step 3. Form the $N_F+N_P \times N_F+N_P+N_C-1$ matrices $C_o^{(i)}$ for all $i=1, \ldots, N_T$ using the formula $$C_o^{(i)} = \begin{bmatrix} h_{o,0}^{(i)} & h_{o,1}^{(i)} & h_{o,2}^{(i)} & \cdots & h_{o,N_C-1}^{(i)} & 0 & 0 & \cdots \\ 0 & h_{o,0}^{(i)} & h_{o,1}^{(i)} & \cdots & h_{o,N_C-2}^{(i)} & h_{o,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{o,N_C-1}^{(i)} \end{bmatrix}.$$

Step 4. Form the $N_F+N_P-1 \times N_F+N_P+N_C-2$ matrices $C_e^{(i)}$ for all $i=1, \ldots, N_T$ using the formula $$C_e^{(i)} = \begin{bmatrix} h_{e,0}^{(i)} & h_{e,1}^{(i)} & h_{e,2}^{(i)} & \cdots & h_{e,N_C-1}^{(i)} & 0 & 0 & \cdots \\ 0 & h_{e,0}^{(i)} & h_{e,1}^{(i)} & \cdots & h_{e,N_C-2}^{(i)} & h_{e,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{e,N_C-1}^{(i)} \end{bmatrix}.$$

Step 5. Form the matrices $C^{(i)}$ for all $i=1, \ldots, N_T$ using the formula $$C^{(i)} = \begin{bmatrix} C_e^{(i)} & 0_{(N_P+N_F-1) \times (L_3^{(i)}-N_P-N_F-N_C+2)} \\ C_o^{(i)} & 0_{(N_P+N_F) \times (L_3^{(i)}-N_P-N_F-N_C+1)} \end{bmatrix}.$$

Step 6. Form the matrices $Q^{(i)}$ for all $i=1, \ldots, N_T$ using the formula $$Q^{(i)} = \begin{bmatrix} 0_{d^{(i)} \times (i-1)N_B} & 0_{d^{(i)} \times N_B} & 0_{d^{(i)} \times (N_T-i)N_B} \\ 0_{N_B \times (i-1)N_B} & I_{N_B} & 0_{N_B \times (N_T-i)N_B} \\ 0_{(L_3^{(i)}-d^{(i)}-N_B) \times (i-1)N_B} & 0_{(L_3^{(i)}-d^{(i)}-N_B) \times N_B} & 0_{(L_3^{(i)}-d^{(i)}-N_B) \times (N_T-i)N_B} \end{bmatrix}.$$

Step 7. Form the $N_P-1 \times N_F+N_P$ matrices $F_{11}^{(i)}$ for all $i=1, \ldots, N_T$, using the formula $$F_{11}^{(i)} = \begin{bmatrix} 0 & f_{e,0}^{(i)} & f_{e,1}^{(i)} & f_{e,2}^{(i)} & \cdots & \cdots & f_{e,N_F-1} & 0 & 0 & \cdots & 0 & 0 \\ 0 & 0 & f_{e,0}^{(i)} & f_{e,1}^{(i)} & \cdots & \cdots & f_{e,N_F-2} & f_{e,N_F-1} & 0 & \cdots & 0 & 0 \\ \vdots & \ddots & \ddots & \ddots & \ddots & \ddots & \ddots & \ddots & \ddots & \ddots & \ddots & \vdots \\ 0 & 0 & 0 & \cdots & f_{e,0} & \cdots & \cdots & \cdots & \cdots & \cdots & f_{e,N_F-1} & 0 \end{bmatrix}.$$

Step 8. Form the $N_P-1 \times N_F+N_P-1$ matrices $F_{12}^{(i)}$ for all $i=1, \ldots, N_T$, using the formula $$F_{12}^{(i)} = \begin{bmatrix} f_{o,0}^{(i)} & f_{o,1}^{(i)} & f_{o,2}^{(i)} & \cdots & \cdots & f_{o,N_F-1} & 0 & 0 & \cdots & 0 & 0 \\ 0 & f_{o,0}^{(i)} & f_{o,1}^{(i)} & \cdots & \cdots & f_{o,N_F-2} & f_{o,N_F-1} & 0 & \cdots & 0 & 0 \\ \vdots & \ddots & \ddots & \ddots & \ddots & \ddots & \ddots & \ddots & \ddots & \ddots & \vdots \\ 0 & 0 & 0 & f_{o,0} & \cdots & \cdots & \cdots & \cdots & \cdots & f_{o,N_F-1} & 0 \end{bmatrix}.$$

Step 9. Form the $N_P \times N_F+N_P$ matrices $F_{21}^{(i)}$ for all $i=1, \ldots, N_T$, using the formula $$F_{21}^{(i)} = \begin{bmatrix} f_{o,0}^{(i)} & f_{o,1}^{(i)} & f_{o,2}^{(i)} & \cdots & \cdots & f_{o,N_F-1} & 0 & 0 & \cdots & 0 & 0 \\ 0 & f_{o,0}^{(i)} & f_{o,1}^{(i)} & \cdots & \cdots & f_{o,N_F-2} & f_{o,N_F-1} & 0 & \cdots & 0 & 0 \\ \vdots & \ddots & \ddots & \ddots & \ddots & \ddots & \ddots & \ddots & \ddots & \ddots & \vdots \\ 0 & 0 & 0 & f_{o,0} & \cdots & \cdots & \cdots & \cdots & \cdots & f_{o,N_F-1} & 0 \end{bmatrix}.$$

Step 10. Form the $N_P \times N_F+N_P-1$ matrices $F_{22}^{(i)}$ for all $i=1, \ldots, N_T$, using the formula $$F_{22}^{(i)} = \begin{bmatrix} f_{e,0}^{(i)} & f_{e,1}^{(i)} & f_{e,2}^{(i)} & \cdots & \cdots & f_{e,N_F-1} & 0 & 0 & \cdots & 0 \\ 0 & f_{e,0}^{(i)} & f_{e,1}^{(i)} & \cdots & \cdots & f_{e,N_F-2} & f_{e,N_F-1} & 0 & \cdots & 0 \\ \vdots & \ddots & \ddots & \ddots & \ddots & \ddots & \ddots & \ddots & \ddots & \vdots \\ 0 & 0 & 0 & f_{e,0} & \cdots & \cdots & \cdots & \cdots & \cdots & f_{e,N_F-1} \end{bmatrix}.$$

Step 11. For $2N_P-1 \times 2N_P+2N_F-1$ matrices $F^{(i)}$ for all $i=1, \ldots, N_T$, using formula $$F^{(i)} = \begin{bmatrix} F_{11}^{(i)} & F_{12}^{(i)} \\ F_{21}^{(i)} & F_{22}^{(i)} \end{bmatrix}.$$

Step 12. Form the matrices $q^{(i)}$ for all $i=1, \ldots, N_T$, using formula $$q^{(i)} = L_d^{(i)T} [C^{(i)T} F^{(i)T} Q(i) T]^T.$$

Step 13. Form the matrices $Z^{(i)}$ for all $i=1, \ldots, N_T$, using formula $$Z^{(i)} = \begin{bmatrix} F^{(i)} C^{(i)} \\ Q^{(i)T} \end{bmatrix} \sigma_x^2 \begin{bmatrix} F^{(i)} C^{(i)} \\ Q^{(i)T} \end{bmatrix}^T.$$

Step 14. Form the matrices $A^{(i)}$ by taking square root of matrices $Z^{(i)}$ e.g., $Z^{(i)} = A^{(i)} A^{(i)*}$, where the operation * refers to taking transpose of matrix and taking the complex conjugate of its entries. Here $A^{(i)}$ may be computed using any matrix square root algorithm.

Step 15. Set vector x as $$x = \begin{bmatrix} p \\ b^{(1)} \\ \vdots \\ b^{(N_T)} \end{bmatrix}.$$

Step 16. Solve the following semidefinite programming optimization problem (using any SDP solver or optimization tool with SDP capability)

$$\begin{array}{c} \text{minimize} \\ t, p, b^{(1)}, \ldots, b^{(N_T)} \end{array} \quad t$$

$$s \cdot t \cdot \begin{bmatrix} tI & A^{(i)}x \\ x^T A^{(i)T} & q^{(i)}x + e^{(i)} \end{bmatrix} \geq 0, \, i = 1 \ldots N_T.$$

Step 17. Set $p=x_{1:(Np)}$

Another aspect of the present invention relates to Analog to Digital Conversion (ADC), which is a process of sampling a continuous-time analog signal in time and mapping these time samples into a digital sequence with finite levels. ADC refers to discretization of an input analog signal in both time and magnitude. For example, Sigma Delta converters provide high resolution analog to digital conversion. The high resolution may be achieved through over-sampling of an input signal at a rate higher than its bandwidth.

A Sigma Delta Analog to Digital (AD) Converter may include at least two stages, such as an Analog Quantizer block and a Digital Combiner-Downsampling block. The Analog Quantizer block oversamples an input analog signal and produces a high-rate digital signal with typically two levels (e.g., 1 bit) or four levels (e.g., 2-bits), for example. This low magnitude resolution over-sampled signal may be converted to a higher magnitude resolution (e.g. 16 bits) and a lower rate signal by the Digital Combiner-Downsampling block.

An embodiment of the present invention is directed to a polyphase combiner and sigma-delta decimator block structure. An embodiment of the present invention provides an efficient implementation of a sigma-delta decimator block which may be enabled by an effective decoupling of a polyphase IIR structure into a cascade of a polyphase FIR bank and a single phase IIR filter. As a result, a reduction in hardware implementation may be achieved by reducing timing requirements for filtering and high rate clock generation. In addition, a reduction in power consumption may be achieved by the use of a lower rate clock. Thus, an embodiment of the present invention provides a low complexity, low power consumption implementation of a sigma delta combiner and decimator blocks through the use of a polyphase structure.

Figure 6:
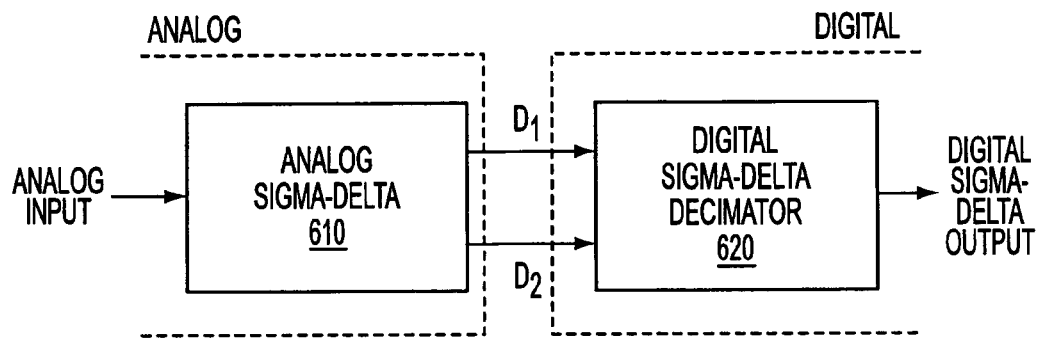
FIG. 6 is a diagram of a receiver sigma-delta block, according to an embodiment of the present invention.

FIG. 6 illustrates an analog to digital converter, according to an embodiment of the present invention. Analog signals are converted into digital signals by A/D Converters by various methods, which may include Sigma-Delta A/D conversion. For high performance Sigma-Delta A/D conversion, an input analog signal may be sampled into a 2-bit (in some cases one bit or other number of bits) high-rate digital signal by Analog Sigma-Delta block 610. The digital signal is then down-sampled and converted into a high resolution (e.g., 16-bit) and lower rate digital signal by a Digital Sigma-Delta Decimator block 620. As shown in FIG. 6, Analog Sigma-Delta block 610 generates a two-bit digital output, $D_1$ and $D_2$. Both $D_1$ and $D_2$ are binary signals with rate R. For example, $D_1$ carries a sampled signal with quantization noise and $D_2$ carries quantization noise cancellation information. The Digital Sigma-Delta Decimator 620 combines $D_1$ and $D_2$ and then decimates the combination by a factor M.

Figure 7:
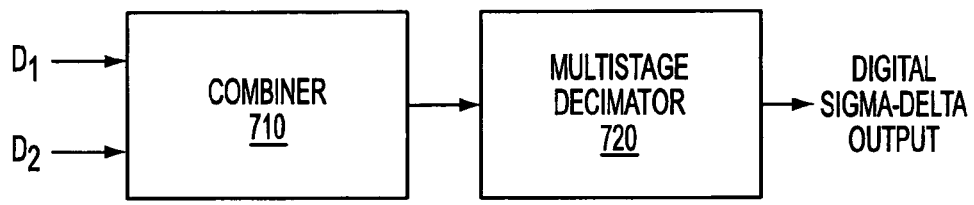
FIG. 7 is a diagram of a digital sigma-delta block, according to an embodiment of the present invention.

FIG. 7 illustrates components of a Digital Sigma-Delta Decimator, according to an embodiment of the present invention. A Digital Sigma-Delta Decimator 620 may include a Combiner 710 and a decimation filter stage which may include a Multistage Decimator 720. Combiner 710 receives $D_1$ and $D_2$ from the Analog Sigma-Delta block 610 and generates a combined signal. The Multistage Decimator 720 receives the combined signal and generates a digital sigma-delta output.

Figure 8:
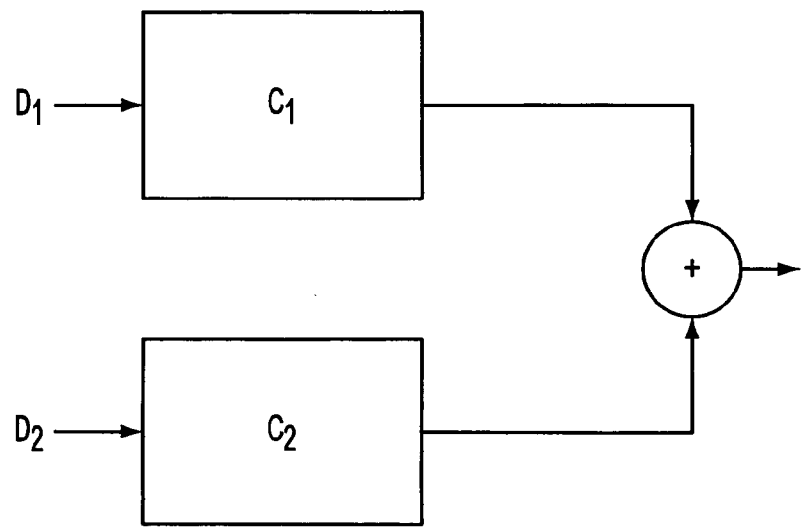
FIG. 8 is a diagram of a combiner structure, according to an embodiment of the present invention.

FIG. 8 illustrates components of a combiner, according to an embodiment of the present invention. Combiner may include two filters, $C_1$ and $C_2$ one for each input branch and a summing junction. For example, $D_1$ may be filtered by filter $C_1$ and $D_2$ may be filtered by filter $C_2$ wherein the filtered signals are combined by a summing junction. Additional filters may be implemented for additional inputs.

Figure 9:
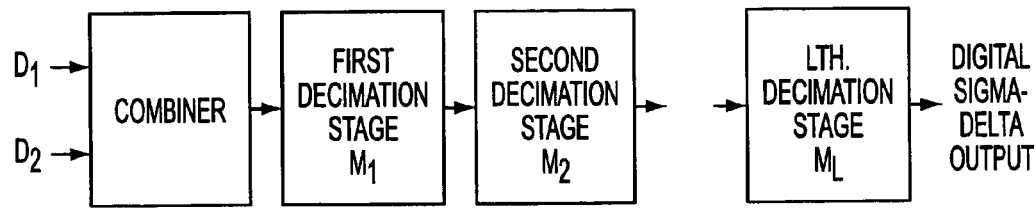
FIG. 9 is a diagram of a digital sigma-delta block with multiple decimation stages, according to an embodiment of the present invention.

FIG. 9 illustrates components of a multistage decimator, according to an embodiment of the present invention. As far as the structure of the decimator is concerned, it may be assumed for an exemplary application that the decimation factor M is not a prime number and therefore may be factored into multiple integer factors, e.g., $$M = M_1 M_2 \ldots M_L.$$

As a result, the decimator, as shown by 720, may be implemented as a L-stage decimator, as shown in FIG. 9. A sub-sampling factor for the first stage, $M_1$, may be an even number, e.g., $M_1 = 2*N$ where N is an integer. The combined signal of $D_1$ and $D_2$ may be received by a first decimation stage having a sub-sampling factor of $M_1$. The output of the first decimation stage may be received by a second decimation stage having a sub-sampling factor of $M_2$. Finally, a Lth decimation stage having a sub-sampling factor of $M_L$ may generate a digital sigma-delta output.

Figure 10:
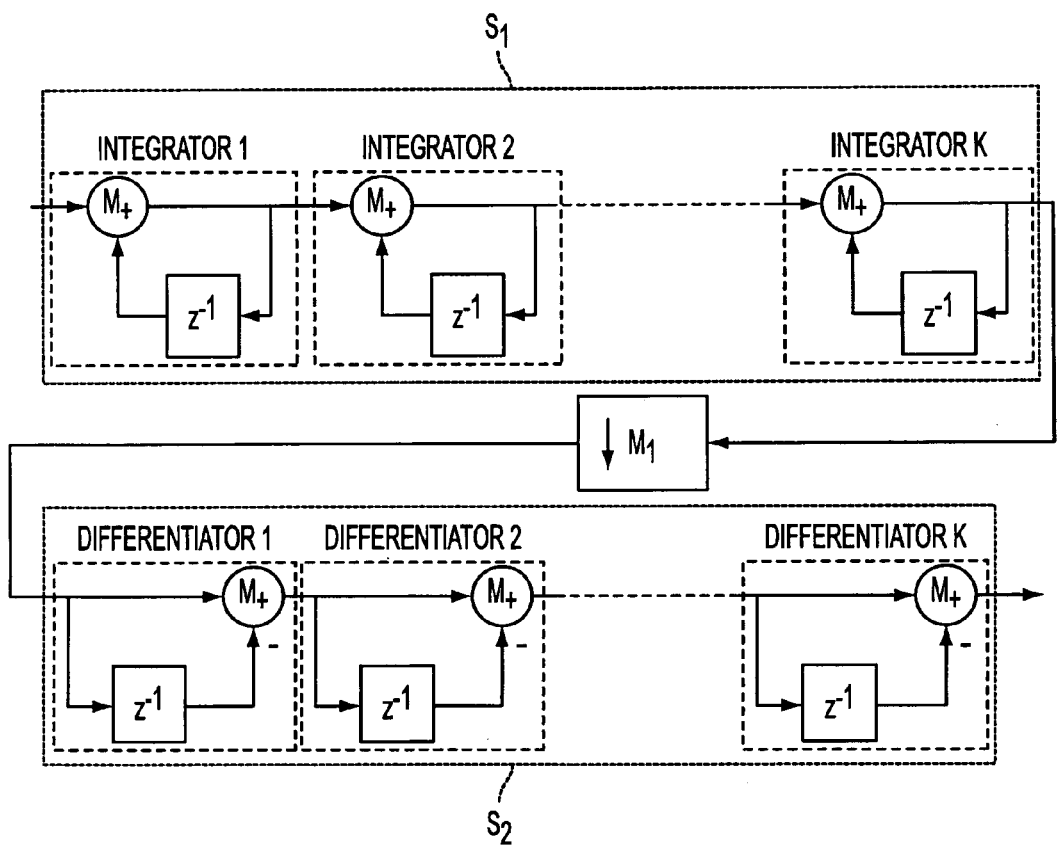
FIG. 10 is a diagram of a first decimator stage with a sinc filter, according to an embodiment of the present invention.

According to one example of an embodiment of the present invention, the first stage may operate with a highest clock rate. The first stage may be implemented with a simple filter such as a Finite Impulse Response (FIR) sinc filter of order K. The combination of the sinc filter and a down-sampling function may be efficiently implemented as shown in FIG. 10. $S_1$ represents a Kth order integrator filter implemented as a cascade of K integrators and $S_2$ represents a Kth order differentiator which may be implemented as a cascade of K differentiators. An advantage of this implementation is that mathematical operations are limited to addition thereby enhancing the simplicity of the method and system.

Figure 11:
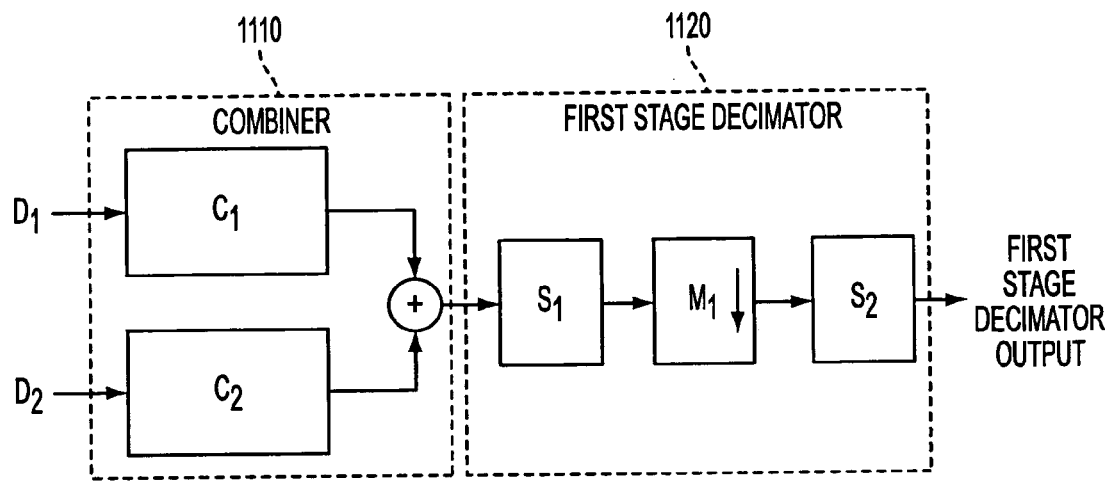
FIG. 11 is a diagram of a combiner-sinc filter, according to an embodiment of the present invention.

FIG. 11 illustrates components of a decimator, according to an embodiment of the present invention. FIG. 11 shows a combiner 1110 and a first stage decimator 1120 with a sinc filter structure. According to an example, the combiner 1110 may operate at a high clock with frequency R MHz. Combiner 1110 includes a filter $C_1$, a filter $C_2$ and a summer. A polyphase structure for the combiner 1110 and sinc filter integrator combination may be implemented such that a lower rate clock may be implemented. This may be accomplished by merging the combiner 1110 and sinc integrator filter operations with a decimation operation as shown by 1120 in FIG. 11. In particular, decimator 1120 includes $S_1$, a downsampling block M and $S_2$. An embodiment of the present invention proposes a low complexity solution for the polyphase structure.

Figure 12:
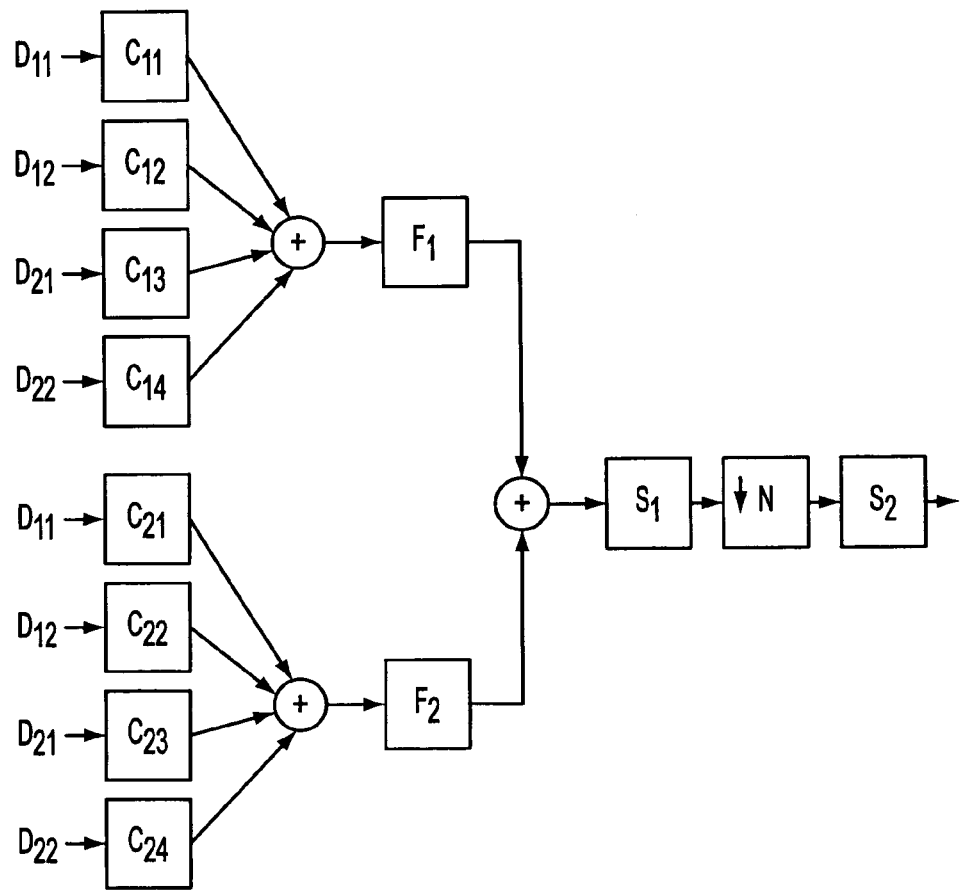
FIG. 12 is a diagram of a polyphase combiner-sinc filter, according to an embodiment of the present invention.

FIG. 12 illustrates a low complexity, efficient polyphase structure, according to an embodiment of the present invention. A first portion of the polyphase structure includes filters $C_{11}$, $C_{12}$, $C_{13}$ and $C_{14}$ for receiving inputs $D_{11}$, $D_{12}$, $D_{21}$, and $D_{22}$ respectively. The outputs of filters $C_{11}$, $C_{12}$, $C_{13}$ and $C_{14}$ are then combined by a first summer and received by filter $F_1$. A second portion of the polyphase structure includes filters $C_{21}$, $C_{22}$, $C_{23}$ and $C_{24}$ for receiving inputs $D_{11}$, $D_{12}$, $D_{21}$, and $D_{22}$ respectively. The outputs of filters $C_{21}$, $C_{22}$, $C_{23}$ and $C_{24}$ are then combined by a second summer and received by filter $F_2$. The outputs of filters $F_1$ and $F_2$ are combined by a third summer and received by a decimator structure. The decimator structure may include a Kth order integrator filter $S_1$, a downsampling function block N and a Kth order differentiator $S_2$. The decimator structure generates a digital sigma-delta output.

The parameter descriptions used in the structures discussed above may include the following:

Combiner Filter $C_1$ of FIG. 11: Combiner Filter 1 has filter coefficients given as $\{c1_k; k \in \{0, \ldots, (2N_1-1)\}\}$ where $2N_1$ is the filter length which is an even value.

Combiner Filter $C_2$ of FIG. 11: Combiner Filter 2 has filter coefficients given as $\{c2_k; k \in \{0, \ldots, (2N_2-1)\}\}$ where $2N_2$ is the filter length which is an even value.

According to an embodiment of the present invention as shown in FIG. 12, the following may apply:

Subsampling factor N: $N = M_1/2$.

Filter C11 has coefficients $\{c11_k; k \in \{0, \ldots, N_1-1\}\}$ where $c11_k = c1_{2k}$ $k \in \{0, \ldots, N_1-1\}$.

Filter C12 has coefficients $\{c12k; k \in \{0, \ldots, N_1\}\}$ where $c12_0 = 0$ and $c12_{k+1} = c1_{2k+1}$ $k \in \{0, \ldots, N_1-1\}$.

Filter C13 has coefficients $\{c13_k; k \in \{0, \ldots, N_2-1\}\}$ where $c13_k = c2_{2k}$ $k \in \{0, \ldots, N_2-1\}$.

Filter C14 has coefficients $\{c14_k; k \in \{0, \ldots, N_2\}\}$ where $c14_0 = 0$ $c14_{k+1} = c2_{2k+1}$ $k \in \{0, \ldots, N_2-1\}$.

Filter C21 has coefficients $\{c21_k; k \in \{0, \ldots, N_1-1\}\}$ where $c21_k = c1_{2k+1}$ $k \in \{0, \ldots, N_1-1\}$.

Filter C22 has coefficients $\{c22_k; k \in \{0, \ldots, N_1-1\}\}$ where $c22_k = c^{(1)}_{2k}$ $k \in \{0, \ldots, N_1-1\}$.

Filter C23 has coefficients $\{c23_k; k \in \{0, \ldots, N_2-1\}\}$ where $c23_k = c2_{2k+1}$ $k \in \{0, \ldots, N_2-1\}$.

Filter C24 has coefficients $\{c24_k; k \in \{0, \ldots, N_2-1\}\}$ where $c24_k = c2_{2k}$ $k \in \{0, \ldots, N_2-1\}$.

Filter $F_1$ has coefficients $\{f1_k; k \in \{0, \ldots, L_{F1}-1\}\}$ where $$L_{F1} = \begin{cases} \frac{K+1}{2} & \text{when } K \text{ is odd} \\ \frac{K}{2} + 1 & \text{when } K \text{ is even} \end{cases}$$

and $$f1_k = \binom{n}{2k} \; k \in \{0, \ldots, L_{F1}-1\}.$$

where $\binom{n}{k} = \frac{n!}{(n-k)!k!}$ and $n! = n^*(n-1)^* \ldots {}^*2^*1$.

Filter $F_2$ has coefficients $\{f2_k; k \in \{0, \ldots, L_{F2}-1\}\}$ where $$L_{F2} = \begin{cases} \frac{K+1}{2} & \text{when } K \text{ is odd} \\ \frac{K}{2} & \text{when } K \text{ is even} \end{cases}$$

and $$f2_k = \binom{n}{2k+1} \; k \in \{0, \ldots, N_{F2}-1\}.$$

For input data sequences $D_{11}$ and $D_{12}$, even sub-samples of $D_1$ may be represented by $D_{11}$ and odd sub-samples of the $D_1$ may be represented by $D_{12}$. An analog sigma delta may provide two outputs, for example, for $D_1$ with one output for ($D_{11}$) and one output for ($D_{12}$) where each line has a rate of R/2. In addition, an analog sigma delta may provide a single output with clock of R/2 with even samples ($D_{11}$) sent at a rising edge and odd samples ($D_{12}$) sent at a falling edge. In the latter case, $D_{11}$ and $D_{12}$ may be obtained as separate lines with rate of R/2 by appropriately sampling the single line output for $D_1$.

For input data Sequences $D_{21}$ and $D_{22}$, even sub-samples of $D_2$ may be represented by $D_{21}$ and odd sub-samples of the $D_2$ may be represented by $D_{22}$. An analog sigma delta may provide two outputs, for example, for $D_2$ with one output for ($D_{21}$) and one output for ($D_{22}$) where each line has a rate of R/2. In addition, an analog sigma delta may provide a single output with clock of R/2 but even samples ($D_{21}$) sent at a rising edge and odd samples ($D_{22}$) sent at a falling edge. In the latter case, $D_{21}$ and $D_{22}$ may be obtained as separate lines with rate of R/2 by appropriately sampling the single line output for $D_1$.

In a Discrete MultiTone (DMT) based communication system (e.g., for supporting ADSL modems), a data stream is partitioned and modulated to be transmitted on several independent sub-channels (also called sub-carriers or tones). Each sub-channel may have a different data rate, depending on transmission conditions and/or other factors. The total data rate of the system may be defined as a summation of the data rates of individual sub-channels. The data rate of each sub-channel may be determined with the consideration of various factors, including the Signal-to-Noise Ratio (SNR) at each tone, the PSD constraint, and/or other considerations. Algorithms that attempt to operate with these often conflicting requirements and further attempt to optimize the data rate allocation among the tones are referenced as bit loading algorithms. According to an embodiment of the present invention, an efficient bit loading algorithm (EBLA) is provided. EBLA may be optimized for DMT systems with a QAM (Quadrature-Amplitude Modulation) scheme and constraints on the transmitting PSD. The bit loading algorithm of an embodiment of the present invention may be applied in any DMT communication systems.

According to an embodiment of the present invention, EBLA may automatically decide whether an optimal solution can be obtained efficiently. If so, an optimal solution is generated. If not, a sub-optimal solution with a performance close to an optimal solution is calculated. For example, EBLA may be optimized for QAM-based systems with PSD constraints where optimal solutions may be obtained efficiently when possible.

An adjustment mechanism may be incorporated into the bit loading algorithm of an embodiment of the present invention to minimize the amount of processing of a Greedy Search Module (GSM). As a result, total computational time may be reduced. When a sub-optimal solution is desired, a water-filling procedure may be implemented to expedite solutions. EBLA may accommodate different modulation and coding methods used in various communication systems.

An embodiment of the present invention provides a reliable and efficient bit loading algorithm for generating an optimal solution when conditions permit, or a sub-optimal solution when computational costs associated with obtaining optimal solutions is formidable.

The following variables may be implemented in the bit loading algorithm of an embodiment of the present invention.

$b_n$ represents the number of data bits allocated to the nth tone, where n represents the tone index. According to an embodiment of the present invention, a total of N tones may be used, e.g., n=1, . . . , N. In ADSL systems, $b_n$ may be an integer ranging from 2 to 15, or may be set to 0, for example.

$e_n(b_n)$ represents power allocated at nth tone in order to transmit $b_n$ data bits.

$\Delta e_n(b_n)$ represents an increment in power required at the nth tone to load one more bit, from $b_{n-1}$ bits to $b_n$ bits, e.g., $$\Delta e_n(b_n)=e_n(b_n)-e_n(b_n-1).$$

E represents an aggregate power allocated for the system, e.g., $$E = \sum_{n=1}^{N} e_n(b_n).$$

B represents an aggregate data rate, e.g., $$B = \sum_{n=1}^{N} b_n.$$

$c_n$ represents a PSD constraint at the nth tone. According to an example, the power level allocated for the nth tone may not exceed this constraint, e.g., $e_n(b_n)$ is less than or equal to $c_n$.

P represents an aggregate power budget. This parameter restricts how much power is allocated for the system, e.g., E is less than or equal to P.

$\alpha_n$ represents a tone condition indicator at the nth tone. This parameter may be proportional to the noise power and depend on the choice of coding scheme.

At least two different bit loading scenarios are recognized. A first scenario involves a Bit-Rate Maximization (BRM) problem. In this scenario, the aggregate data rate B is maximized under certain constraints. These constraints may involve the total power being less or equal to P and the power at each tone being less or equal to the PSD constraint, e.g., $e_n(b_n) \leq c_n$. A second scenario involves a Margin Maximization (MM) problem. In this scenario, an aggregate data rate B is given and the total power required by the system is maximized to support that data rate, with or without the PSD and/or other constraints. Other scenarios may be implemented.

For example, in a DMT system, such as a system for supporting ADSL modems, the BRM problem generally occurs more frequently. In this scenario, a total power constraint is closely related to the PSD constraint. As a result, an optimal solution may be obtained easily for the BRM problem. On the other hand, the MM problem is inherently a more complicated scenario. Therefore, an optimal solution may be determined with a much higher computational cost.

EBLA of an embodiment of the present invention exploits advantages of the first scenario (the BRM problem) and generates one or more optimal solutions. For the MM problem, an embodiment of the present invention provides one or more acceptable sub-optimal solutions with a moderate or reasonable computational cost.

Figure 13:
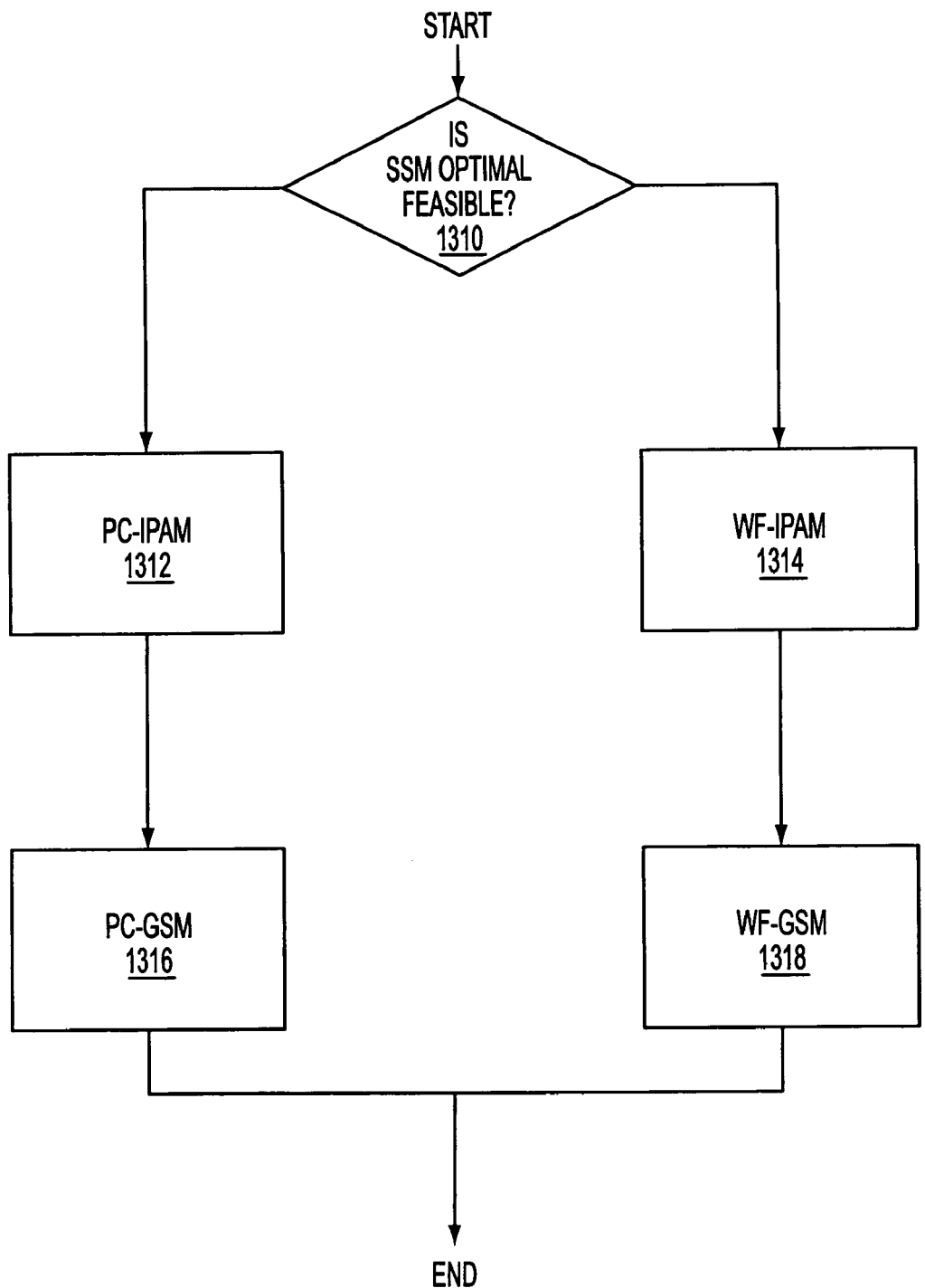
FIG. 13 is the flowchart of an efficient bit loading algorithm, according to an embodiment of the present invention.

FIG. 13 is the flowchart of an efficient bit loading algorithm, according to an embodiment of the present invention. FIG. 13 incorporates functional modules, which may include Scenario Selection Module (SSM) 1310, PSD-Constrained Initial Power/bit Allocation Module (PC-IPAM) 1312, Water-Filling Initial Power/bit Allocation Module (WF-IPAM) 1314, PSD-Constrained Greedy Search Module (PC-GSM) 1316, and Water-Filling Greedy Search Module (WF-GSM) 1318. Other functional modules may also be incorporated in accordance with an embodiment of the present invention.

According to an embodiment of the present invention, there are at least two paths in the execution of the bit loading algorithm. SSM 1310 determines which path to implement based on various conditions and factors. Based on an output of SSM 1310, PC-IPAM 1312 and PC-GSM 1316 may be used to generate optimal bit loading solutions. If an optimal solution is not deemed feasible at SSM 1310, WF-IPAM 1314 and WF-GSM 1318 may be used to generate sub-optimal solutions in an efficient manner.

SSM 1310 decides whether a BRM or MM problem applies and invokes PC-IPAM 1312 or WF-IPAM 1314 accordingly. In addition, SSM 1310 may distinguish among other problems or scenarios as well. SSM 1310 also obtains information on the transmission condition and calculates the tone condition indicator $\alpha_n$, which reflects the condition on the nth tone.

IPAM generates an initial power and/or bit allocation efficiently. In particular, the initial power or bit allocation should be close to an optimal bit loading solution so that a small number of adjustments may be made by GSM for obtaining optimal or sub-optimal solutions. Depending on the output of SSM 1310, either PC-IPAM 1312 or WF-IPAM 1314 may be invoked.

For a BRM problem, PC-IPAM 1312 efficiently obtains an initial power and/or bit allocation close to an optimal bit loading solution. The procedure takes advantage of the fact that the scenario (or condition) is essentially PSD-constrained. In ADSL systems, a total power constraint may include the power transmitted by a "nominal" PSD, which refers to the PSD constraint lowered by the amount of approximately 2.5 dB.

To devise an efficient PC-IPAM 1312, information related to a system's modulation may be incorporated into the bit loading algorithm of an embodiment of the present invention. For example, in ADSL systems, the QAM scheme may be adopted for modulation (or other purpose). IPAM may incorporate a built-in table (or other reference) of power $e_n(b_n)$ based on QAM (or other schemes). FIG. 14 illustrates a table of number of bits and power levels for incorporation into the bit loading algorithm, according to an embodiment of the present invention. Other variations or types of references may be used. In particular, the table of FIG. 14 illustrates the relation between the number of data bits and the power level for supporting the number of data bits in an ADSL modem compliant to ITU G.992.1 standard (or other standard). Based on this table (or other similar reference), IPAM may determine an initial bit and power allocation.

Figure 15:
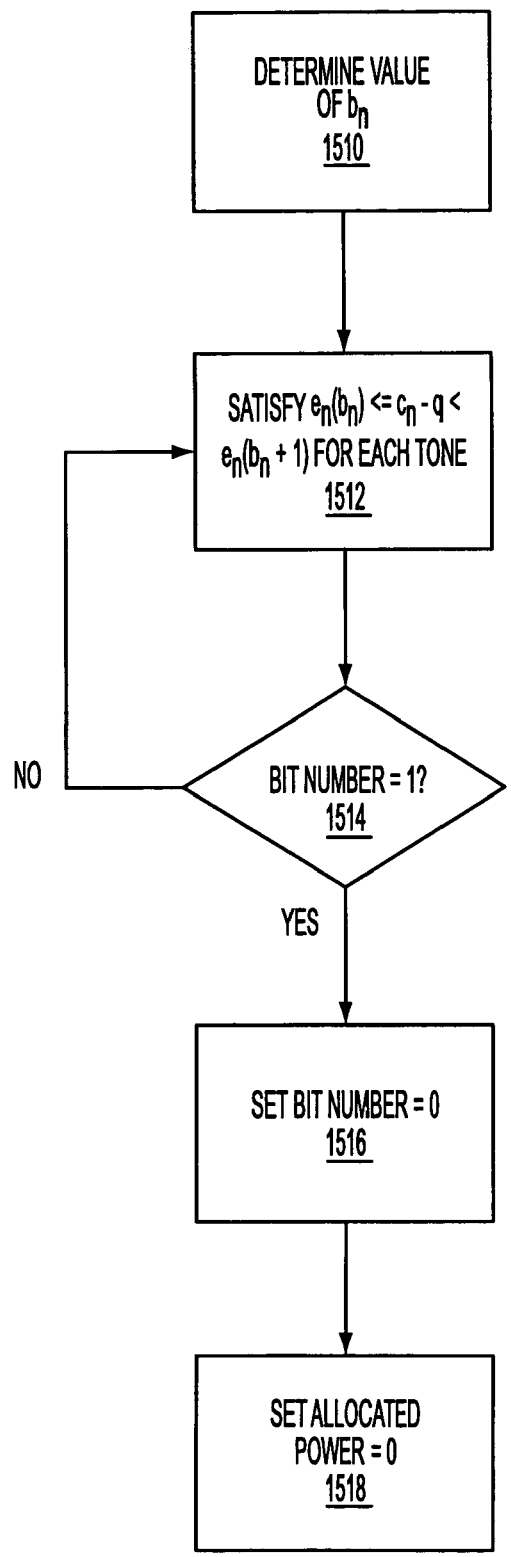
FIG. 15 is a flowchart illustrating PC-IPAM, according to an embodiment of the present invention.

FIG. 15 is a flowchart illustrating PC-IPAM, according to an embodiment of the present invention. The steps of FIG. 15 may be designed for ADSL modems. At step 1510, a value of $b_n$ may be determined. The value of $b_n$ may be selected such that $e_n(b_n) \leq c_n - q < e_n(b_n+1)$ for each tone, where $c_n$ is the PSD constraint, $b_n$ is the bit allocation, $e_n(b_n)$ is the power allocation, and q is an adjustment factor, as determined at step 1512. At step 1514, if a bit number at some tones equals 1, then the bit number at that tone may be set to 0, at step 1516 and the allocated power may be set to 0, at step 1518 because G.992.1 does not allow 1 bit to be loaded. The resulting bit and power allocation may be referred to as an initial bit and power allocation. Depending on other conditions and constraints, other values may be assigned to the variables.

The adjustment factor q, if chosen properly, is highly effective in enabling the initial power and bit allocation to represent an optimal solution, thereby reducing computational costs at GSM. For example, a value corresponding to 1.5 dB decrease is a reasonable choice. However, for additional effectiveness, the value for the adjustment factor should be chosen based on conditions, such as a transmission condition. For example, if the transmission condition is such that many tones are usable on the condition that they are allocated with a power level greater the nominal PSD, then q may be reduced.

Figure 16:
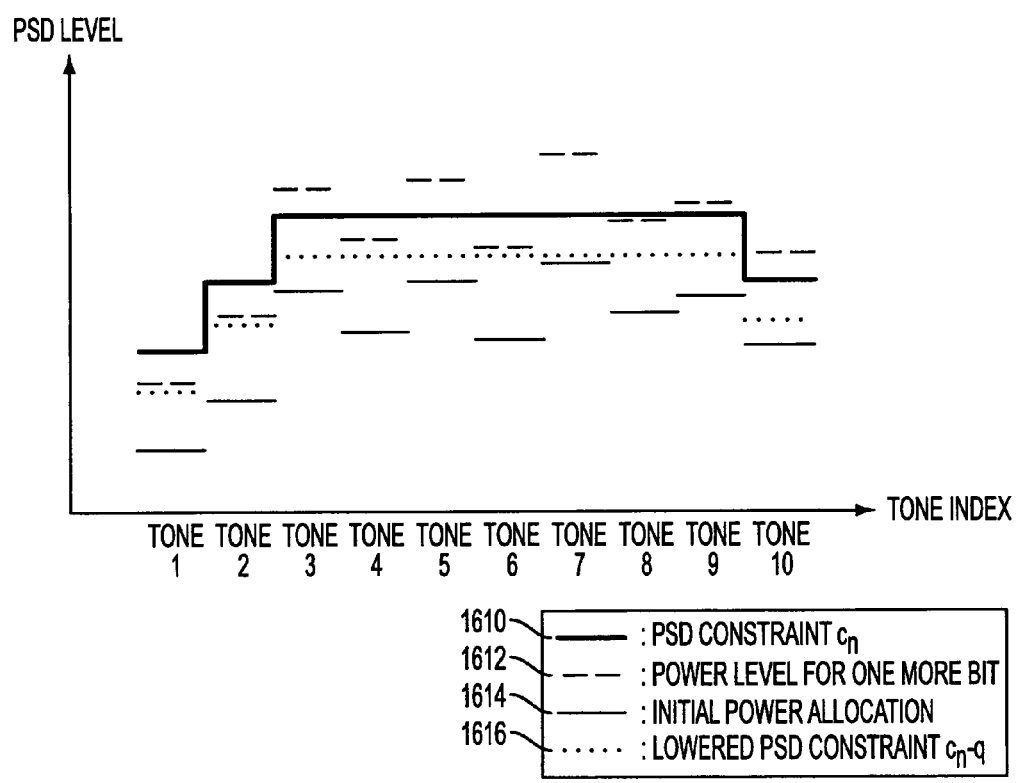
FIG. 16 illustrates an example of an output of PC-IPAM, according to an embodiment of the present invention.

FIG. 16 illustrates an example of an output of PC-IPAM 1312, according to an embodiment of the present invention. There are 10 tones in this example. The thick solid line 1610 represents PSD constraint $c_n$. The dotted line 1616 represents a power level $c_n-q$. The thin solid line 1614 represents an initial power allocation $e_n(b_n)$ and the dashed line 1612 represents a power level to support one more bit, e.g., $e_n(b_n+1)$. The inequality $$e_n(b_n) \leq c_n - q < e_n(b_n+1)$$

holds for all n=1 to 10. As shown in FIG. 16, several tones may be loaded with one more bit without violating the PSD constraint. For example, tone 1 and 2 are examples of such tones. Also, there are tones where no more bits can be loaded without violating the PSD constraint. Tone 3 and 5 are examples of such tones. Whether to load more bits may depend on the amount of the total power budget remaining. This decision as well as choosing which tones to load more bits may be handled in the next procedure, GSM, as discussed in detail below.

For a MM scenario, the computational cost to obtain optimal solutions may be considered formidable. The bit loading algorithm of an embodiment of the present invention incorporates a combination of WF-IPAM 1314 and WF-GSM 1318 to provide sub-optimal solutions which are close to the optimal solutions at low costs and effort. The name "Water-Filling" refers to a procedure of calculating optimal transmitting PSDs for general communication systems. WF-IPAM 1314 generates water-filling solutions and then truncates the solutions to meet various requirements and/or conditions associated with DMT systems, e.g., ADSL modems. The resulting solutions of an embodiment of the present invention are close to optimal solutions, also known as sub-optimal solutions.

Figure 17:
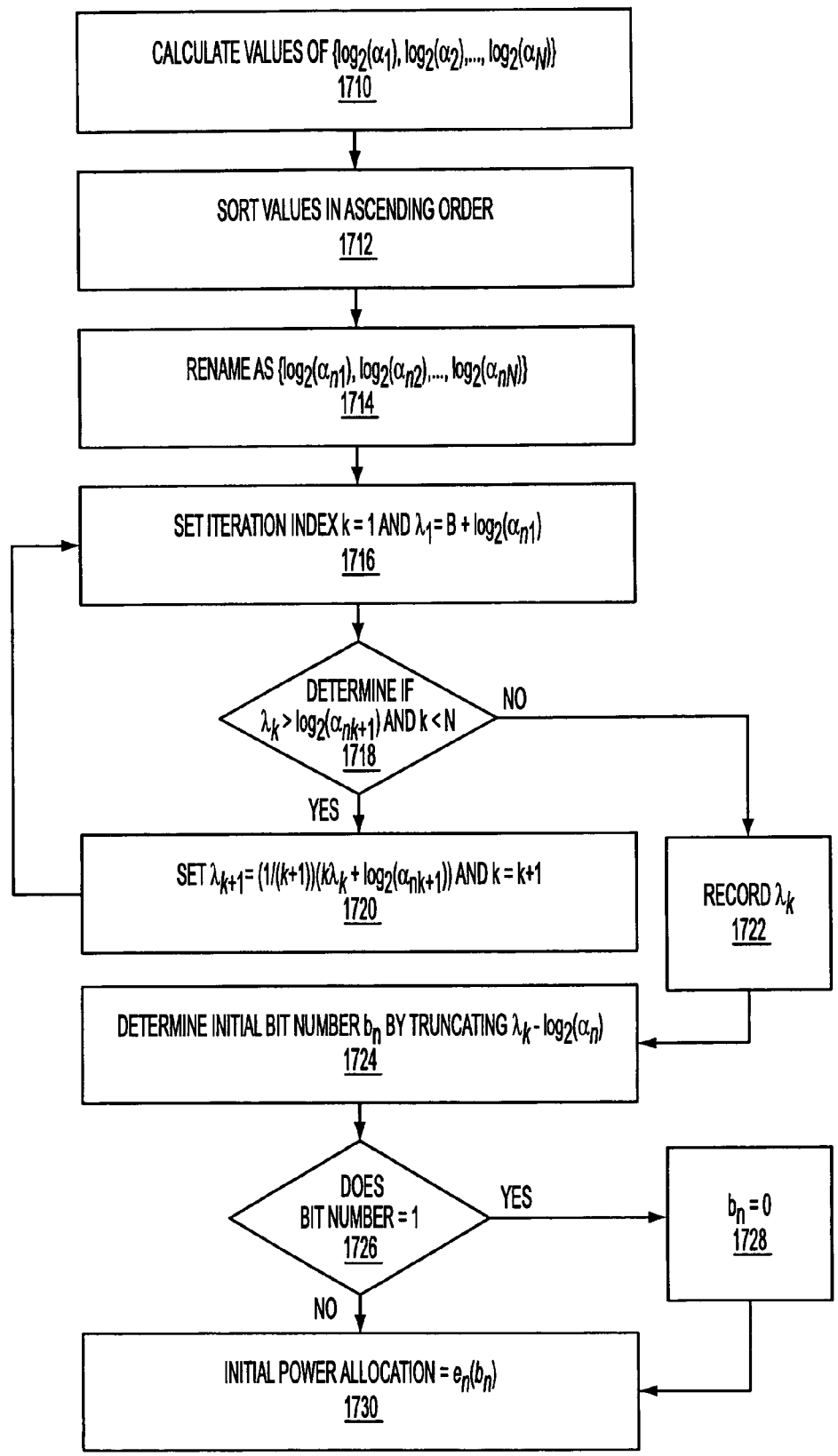
FIG. 17 is a flowchart illustrating WF-IPAM, according to an embodiment of the present invention.

FIG. 17 is a flowchart illustrating WF-IPAM, according to an embodiment of the present invention. The procedure of FIG. 17 may be designed for ADSL modems, for example. At step 1710, the values of $\{\log_2(\alpha_1), \log_2(\alpha_2), \ldots, \log_2(\alpha_N)\}$ may be calculated. At step 1712, these calculated values may be sorted in an order, such as in ascending order. At step 1714, the sorted values may be renamed as $\{\log_2(\alpha_{n1}), \log_2(\alpha_{n2}), \ldots, \log_2(\alpha_{nN})\}$. At step 1716, a water-filling procedure may be initiated by setting an iteration index k=1 and $\lambda_1 = B + \log_2(\alpha_{n1})$. At step 1718, it may be determined whether $\lambda_k > \log_2(\alpha_{nk+1})$ and k<N are satisfied. If so, at step 1720, the equation $\lambda_{k+1} = (1/(k+1))(k\lambda_k + \log_2(\alpha_{nk+1}))$ is set where k is increased by a predetermined value, such as 1. Step 1716 is then repeated. Otherwise, the value of $\lambda_k$ is recorded at step 1722. At step 1724, the initial bit number $b_n$ may be determined by truncating the value of $\lambda_k - \log_2(\alpha_n)$ to an integer. If it is determined that the value of the bit number is 1, at step 1726, then $b_n$ is set to a predetermined value, such as 0, at step 1728. The initial power allocation may be calculated as $e_n(b_n)$, at step 1730.

There may be instances where the initial bit allocation does not achieve the aggregate data rate. In other words, the summation of $b_n$ may be less than B. Therefore, WF-GSM provides a fine tuning function for the truncated water-filling solution. The details of WF-GSM are discussed below.

GSM functionality fine tunes the initial power and bit allocation. Depending on the output of SSM 1310, PC-GSM 1316 or WF-GSM 1318 may be implemented. Other options may also be available. PC-GSM 1316 produces optimal bit loading solutions, while WF-GSM 1318 produces sub-optimal solutions, in response to the particular conditions and/or other factors.

Figure 18:
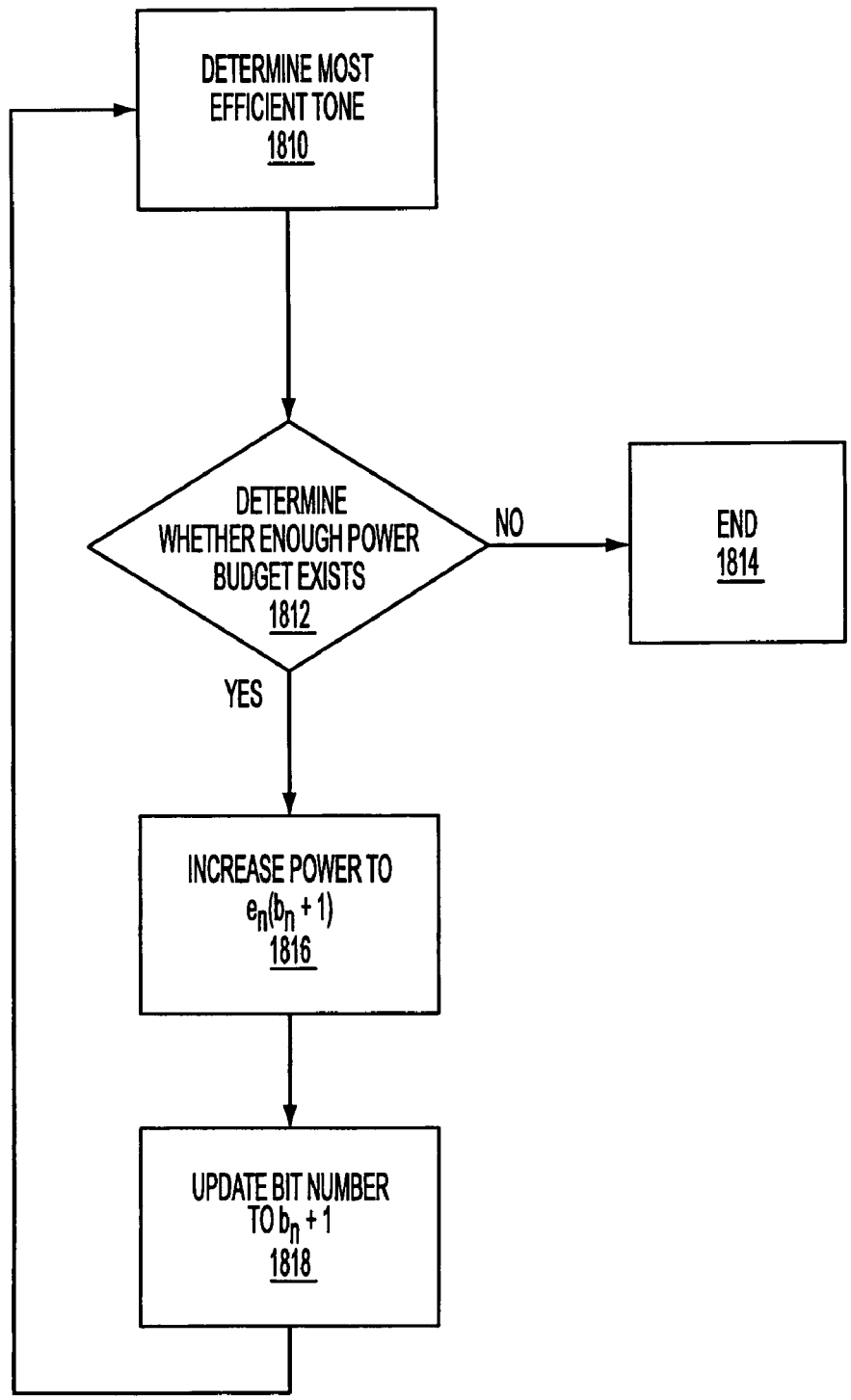
FIG. 18 is a flowchart illustrating PC-GSM, according to an embodiment of the present invention.

FIG. 18 is a flowchart illustrating PC-GSM, according to an embodiment of the present invention. In particular, FIG. 18 illustrates the steps involved in PC-GSM 1316. At step 1810, an efficient tone may be determined. This may involve determining which tone has the smallest (or a small enough) $\Delta e_n(b_n+1)$ and whether the tone is permissible as determined by an increased power level not exceeding the PSD constraint $c_n$ and the number of bits not exceeding a predetermined value. Other constraints may be taken into consideration. At step 1812, whether enough power budget is left for the tone may be determined. If so, the power at that tone may be increased to $e_n(b_n+1)$ at step 1816. At step 1818, the bit number may be updated to $(b_n+1)$. These steps may be repeated until no other bits can be added without exceeding the aggregate power budget or until permissible tones are unavailable, at which point the process is terminated at step 1814.

The procedure as used in ADSL modems, for example, may be further optimized by taking into account special requirements and/or conditions associated with ADSL. When choosing an efficient and permissible tone, $\Delta e_n(b_n+1)$ may be used for tones whose initial $b_n$ is larger than 1, and $(\frac{1}{2})\Delta e_n(2)$ for tones whose initial $b_n$ is 0. If a tone with initial $b_n=0$ is chosen, power allocation for that tone may be increased from 0 to $e_n(2)$ and the bit number from 0 to 2.

Figure 19:
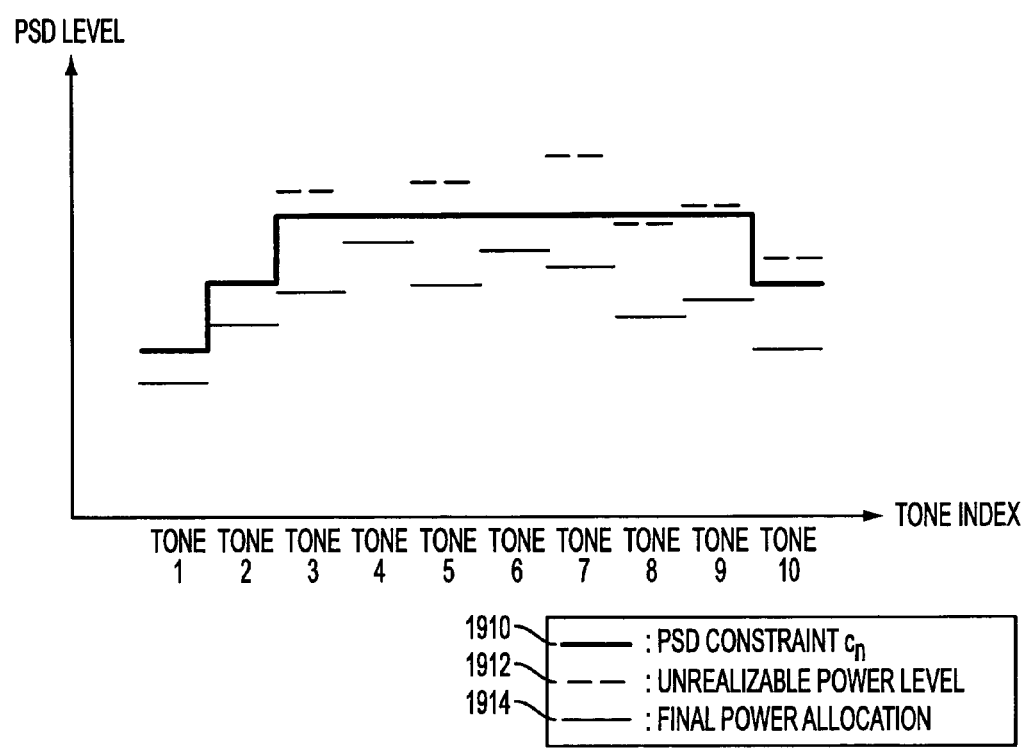
FIG. 19 illustrates an example of an output of GSM, according to an embodiment of the present invention.

FIG. 19 illustrates an example of an output of PC-GSM 1316, according to an embodiment of the present invention. In response to an input received from PC-IPAM 1312, PC-GSM 1316 may choose tones 1, 2, 4, and 6 to increase the allocated power and bit number, as shown in FIG. 19. Even though tone 8 may be loaded one more bit without violating the PSD constraint, it is not chosen because the remaining power budget is not enough to support an additional bit.

WF-GSM 1318 follows the steps as illustrated in FIG. 18, according to an embodiment of the present invention. The steps discussed above in connection with FIG. 18 may be repeated until the aggregate data rate requirement is met, the remained power budget is not enough, or permissible tones are unavailable. For ADSL modems, WF-GSM 1318 may be modified in a similar manner as PC-GSM 1316 may be optimized for ADSL. Other modifications may be made for other types of modems and/or systems.

The computational complexity of the PC-IPAM 1312 and PC-GSM 1316 is approximately kN where N represents a number of tones involved and k represents an integer, usually around 20 to 30 when N=256, for example.

GlobespanVirata Corporation's Aluminum™ DSL PHY is designed for full duplex symmetric transmission over ordinary single twisted copper pair when used, for instance, with the Aluminum Analog Front End (AFE). This chipset supports programmable data rates ranging from 192 Kbps to 4.6 Mbps on a single pair, and provides reach greater than 18,000 feet at 1.5 Mbps. Loop-lengths of up to 26,000 ft are supported at lower data rates.

The Aluminum™ chipset includes digital communications subsystems, which may include a combination of echo canceller, pre-coder, feed forward equalizer and decision feedback equalizer. GlobespanVirata also offers its customers a comprehensive suite of technology solutions available to aid in the design, development and deployment of symmetric DSL products. This includes the BD3801 development reference platform for the Aluminum™ chipset. Aluminum™ and the Aluminum™ AFE are HDSL2/G.shdsl/2B1Q Synchronous Digital Subscriber Line (SDSL) compliant.

The Aluminum™ chipset provides customers with a data throughput increase of up to 100 percent over competitive G.shdsl solutions and enables the development of symmetric DSL products with lower power consumption, greater reach and higher performance than was previously possible. Aluminum™ and Aluminum™ AFE may be purchased as a bundle with GlobespanVirata's Helium™ communications processor and comprehensive network protocol stack, creating a complete customer premises equipment solution for symmetric DSL gateways, routers, and integrated access devices (IAD). In support of this symmetric DSL chipset and software solution, GlobespanVirata is also delivering a symmetric DSL to Ethernet router reference design.

Helium™ is a low-cost, Physical Layer Device (PHY)-neutral communications processor that enables high-speed Internet access capability for single- and multiple-user endpoint devices such as Universal Serial Bus (USB) modems, home gateway devices and small office/home office (SOHO) routers. The Helium™ chip may be fully integrated with a networking and protocol software suite that handles Asynchronous Transfer Mode (ATM), frame, routing, bridging and signaling functions, as well as Simple Network Management Protocol (SNMP) management.

Figure 20:
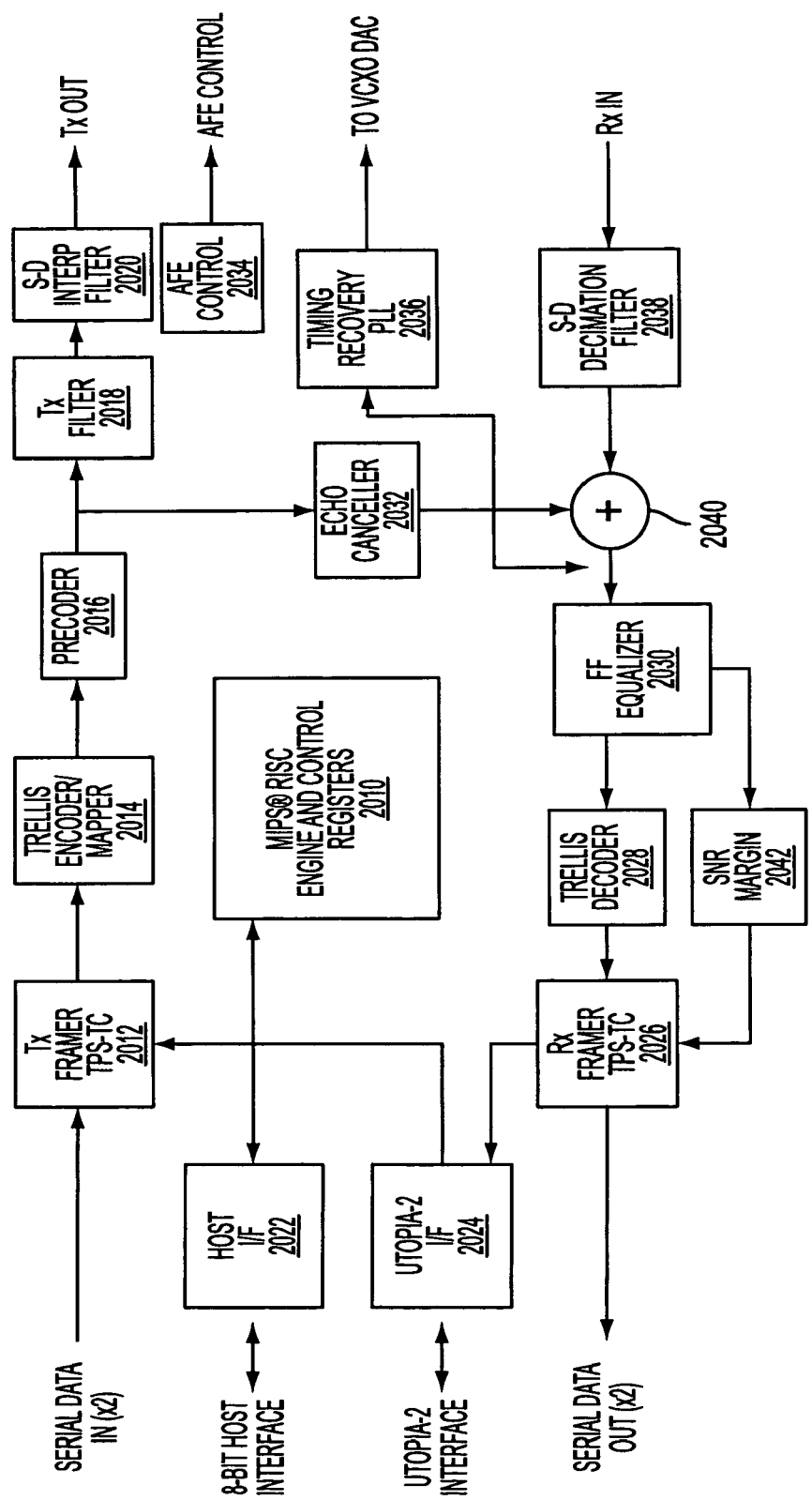
FIG. 20 is a schematic diagram of a hardware architecture in which the inventive aspects of the present invention may be incorporated.

FIG. 20 is a schematic diagram of a hardware architecture in which the inventive aspects of the present invention may be incorporated. The inventive concepts discussed above may be achieved with the processing aid of Million Instructions per Second (MIPS) 2010 shown in FIG. 20. For example, the functionality related to rate enhanced SHDSL and efficient polyphase implementation of sigma delta analog to digital converter may be implemented in the Aluminum™ 200 and/or 204 DSL Processor, as detailed below. The inventive concepts discussed above may be incorporated into chip sets, such as GlobespanVirata Corporation's Aluminum™ 200 or 204 DSL Processor, which is also known as GlobespanVirata's second generation symmetric high-speed DSL processor. Aluminum™ 200 or 204 may support several modes of operation including: International Telecommunications Union (ITU) G.991.2 (G.shdsl), American National Standard Institute (ANSI) T1E1.4 (High Speed Digital Subscriber Line (HDSL) 2) and single-pair 2B1Q SDSL. A solution for customer premises G.shdsl equipment, Aluminum™ 200 or 204 provides compliance with the ITU G.991.2 standard, as well as other standards. Data rates from 192 Kbps to 2.3 Mbps are supported on 8 Kbps boundaries. In addition, Aluminum™ 200 or 204 provides at least three additional base data rates above 2.3 Mbps: 3.096 Mbps, 4.104 Mbps and 4.616 Mbps.

The power spectral density (PSD) of the transmitted signal is programmable and supports defined symmetric and asymmetric PSDs. In addition, the adaptability of the PSD shaper may allow support of new PSDs that may be defined in the future.

The Aluminum™ 200 or 204 DSL Processor may support Transmission Protocol Specific-Transmission Convergence (TPS-TC) defined in G.991.2 including dual-bearer mode. By providing at least two independent serial channels, in addition to a UTOPIA Level 2 port, the Aluminum™ 200 or 204 may provide services such as simultaneous Synchronous Transfer Mode (STM) voice and ATM data transport.

Support for analog voice and G.shdsl on the same copper pair is provided through the Aluminum™ 200's or 204's G.shdsl-over-POTS mode. By using this capability, vendors and other entities may deliver the reach and symmetric performance of G.shdsl without giving up POTS service. G.shdsl-over-POTS further works with current ADSL splitters and microfilters, as well as other devices and components.

The Aluminum™ 200 or 204 DSL Processor may work in conjunction with GlobespanVirata's Aluminum™ 200 Smart Analog Front End/Line Driver device, for example. The Aluminum™ 200 or 204 may control the Aluminum™ 200 AFE through a digital serial bus and may further provide for parameter calibration, power cutback and other functions. This configurability of the present invention allows the AFE to better match line conditions for higher performance and greater reach.

The BD3802 is a development platform for Aluminum™ 200 or 204 DSL Chipset, providing a comprehensive set of hardware and firmware tools to assist users in rapid development and deployment of products and services.

Product applications may include Symmetric DSL routers and Integrated Access Devices (IAD); DSL Access Multiplexers (DSLAMs); Multi-tenant and Multi-dwelling unit networks; T1/E1 distribution products; and T1/E1 pairgain systems (using 3 Mbps and higher data rates).

Specification details may include ITU G.991.2 (G.shdsl) compliant; T1E1.4 HDSL2 compliant; ETSL ETR-152 compliant (single pair); support for data rates, presently, from 192 Kbps to 4616 Kbps on 8 Kbps increments; programmable framer supports G.shdsl, HDSL2, European Telecommunications Standard Institute (ETSI) SDSL, HDSL and transparent framing; UTOPIA Level 2 interface for ATM data and two independent serial interfaces for STM data; and 8-bit multiplexed or non-multiplexed host bus to connect to a variety of host Central Processing Units (CPUs).

As shown in FIG. 20, MIPS Reduced Instruction Set Computing (RISC) engine and control registers 2010 may be coupled to a host interface 2022, which may in turn be coupled to a 8-bit host interface. A serial data input may be coupled to an input of Tx Framer TPS-TC 2012, which is further coupled to a Trellis Encoder/Mapper 2014. Trellis Encoder/Mapper 2014 may provide an input to Precoder 2016 where Precoder 2016 may be coupled to a Tx Filter 2018. Tx Filter 2018 may be coupled to (sigma-delta) S-D interpolating filter 2020 which is coupled to an output, Tx out. Utopia-2 Interface 2024 may be coupled to an input of Tx Framer TPS-TC 2012 and may further receive data from a Rx Framer TPS-TC 2026. S-D Decimation filter 2038 receives an input from Rx In and is coupled to an adder 2040. Adder 2030 sums outputs from filter 2038 and echo canceller 2032 and generates an output to Feed Forward (FF) equalizer 2030. FF equalizer 2030 may be coupled to a Timing Recovery Phase Locked Loop (PLL) 2036 at an input. At an output, Timing Recover PLL 2036 may be coupled to Volt Controlled Oscillator Digital Analog Converter (VCXO DAC), which in the case of the STUR is used to adjust the sampling phase to match that of the transmitting modem. FF equalizer 2030 may be coupled to a Trellis Decoder 2028, which may be in turn coupled to Rx Framer TPS-TC 2026. In addition, in the case of the Aluminum™ 204, a SNR margin 2042 may be coupled to FF equalizer 2030 and Rx Framer TPS-TC 2026, which may be further coupled to a Serial Data output.

Figure 21:
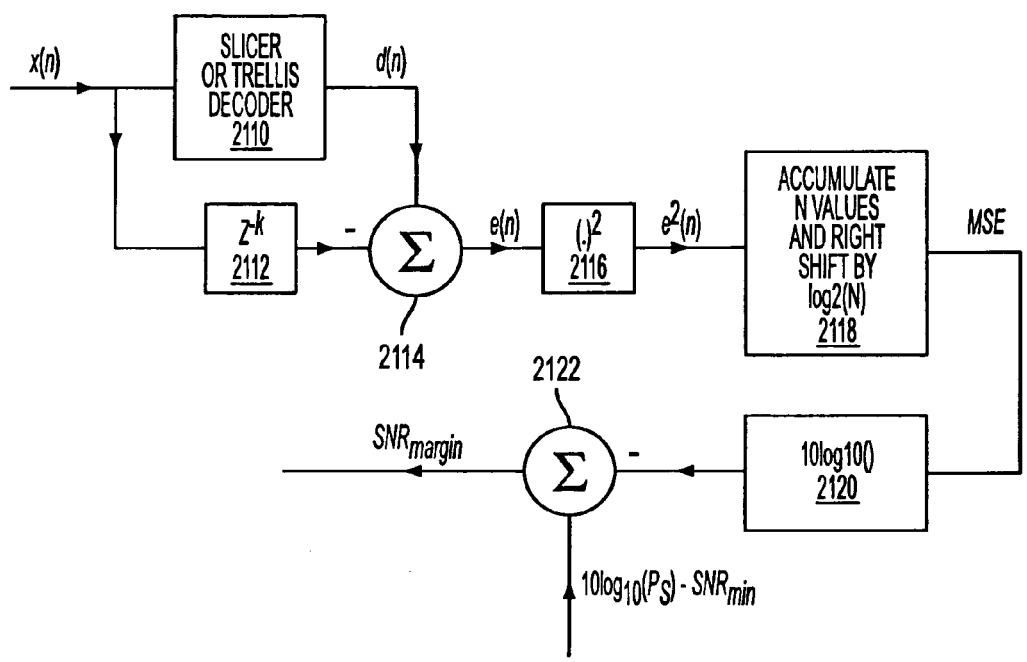
FIG. 21 is a block diagram illustrating details of SNR margin, according to an embodiment of the present invention.

In particular, Aluminum™ 204 may include SNR margin 2042, as discussed above and as shown in FIG. 20. Details of SNR margin 2042 are shown in FIG. 21. A purpose of a SNR-margin estimator may include determining SNR for a given constellation and input signal. The output of the estimator may include the SNR margin value in dB. The SNR-margin estimator may include a hardware module that performs the SNR computation. Software may select certain parameters based on the constellation type. FIG. 21 illustrates a block diagram showing the basic operation of a SNR-margin estimator.

A hardware module may perform a SNR-margin estimate that operates on a continuous stream of input samples and produces a SNR value. The margin may be found by comparing SNR to a minimum value. The software may perform a function of specifying the number of samples to average over as well as the signal power for a particular constellation.

The error signal may be computed by subtracting an input sample from a decoder or slicer output as shown in equation below.

$$e(n)=d(n)-x(n-K)$$

For example, slicer or decoder 2110 may receive an input signal x(n) to generate an output of d(n). In addition, input signal x(n) may be an input to function 2112 (e.g., $z^{-K}$) for generating an output to be subtracted from d(n) by adder 2114. The output of adder 2114 may include an error signal as defined in the equation above.

K may be defined as the delay through the decoder or slicer and d(n) may be a soft-decision output of Trellis decoder or an output of a slicer 2110. This error signal may be equal to the noise in the signal if the assumption is made that the decision, d(n), is correct. This leads to a mean-squared-error (MSE) being approximately equal to the noise power as shown in equation below.

$$E[e^2(n)] = MSE \cong \frac{1}{N}\sum_{n=0}^{N-1} (d(n) - x(n - K))^2 \cong P_n$$

$$SNR = 10\log_{10}\left(\frac{P_s}{P_n}\right) \cong 10\log_{10}\left(\frac{P_s}{MSE}\right)$$

$$= 10\log_{10}(P_s) - 10\log_{10}(MSE)$$

Function 2116 may receive error signal e(n) and generate a square of the error signal $e^2(n)$. Function 2118 may receive squared error signal and generate MSE. In particular, function 2118 may accumulate N values and right shift by log2(N).

The signal power for a given constellation is known, so the first term on the right of equation above is a constant and the MSE dB value may be computed. For the log estimation, the following may be used. The desire is to estimate $\log_2$ (MSE), $$MSE=2^k=2^{(k_i+k_f)}=2^{k_i}2^{k_f}$$

where the exponent k is the sum of an integer part, $k_i$, and a fractional part (less than 1), $k_f$, as shown below.

$$k=k_i+k_f$$

A rough approximation of $\log_2$(MSE) may be found using the following equation, $$\log_2(MSE) \cong k_i + \hat{k}_f = k_i + \frac{x}{2^{k_i}} - 1$$

Where $k_i$ is found by noting the position of the most significant bit (MSB). Function 2120 may receive MSE and generate $10\log_{10}$(MSE). In particular, the estimate of the fraction, $k_f$, may then be improved by estimating the logarithms nonlinear fractional component using equation below.

$$k_f \cong 0.0090+1.3211\hat{k}_f-0.3369\hat{k}_f^2$$

The result is the approximate $\log_2$(MSE) of an integer number. To find $10\log_{10}$(MSE), the scaling operation in equation below may be performed.

$$10 \log_{10}(MSE)=10 \log_{10}(2)\log_2(MSE)$$

Finally, the SNR margin may be computed using equation below.

$$SNR_{margin}=SNR-SNR_{min}$$

Adder 2122 may be used to calculate SNR margin by subtracting the result of function 2120 from $10\log_{10}(P_s)$–$SNR_{min}$. The following precisions may be assumed, such as Polynomial coefficients are 10-bits {0x002, 0x152, 0x3aa}; power samples are 16-bits; the rough estimate of the log fraction, $\hat{k}_f$, is minimum 8-bits; the resulting log is 16 bits, 6 integer and 10 fractional bits.

An example may include the following log estimation where $\log_2$(0000000010101010b) may be calculated.

The bit location of the first 1 is 7 so this means $k_i$=7=111. To estimate $\hat{k}_f$, the MSB is removed leaving 0101010b, which is the rough estimate of the fractional part of the log. The rough estimate of $\log_2$ is then 111.0101010, which is 7.328125. $k_f \cong (0.0090)+(1.3211)(0.328125)+(0.3369)(0.328125)^2$. Therefore, k≅7.4062 To find $10\log_{10}$(0000000010101010b), $10\log_{10}(2)*k$=22.2949. The actual result calculated with a calculator is 22.304.

Several parameters may be implemented by software for the proper operation of the SNR-margin estimator. The number of samples to average over, N, may be input by software. This is input as $\log_2$ (N) and hardware will set the appropriate bit in a counter and then use the input value for the final shift. Another parameter may include the logarithm of the signal power. This value may be constellation specific and may be a parameter input by software even if the module works with one constellation. Yet another parameter may include the minimum SNR acceptable, $SNR_{min}$.

Figure 22:
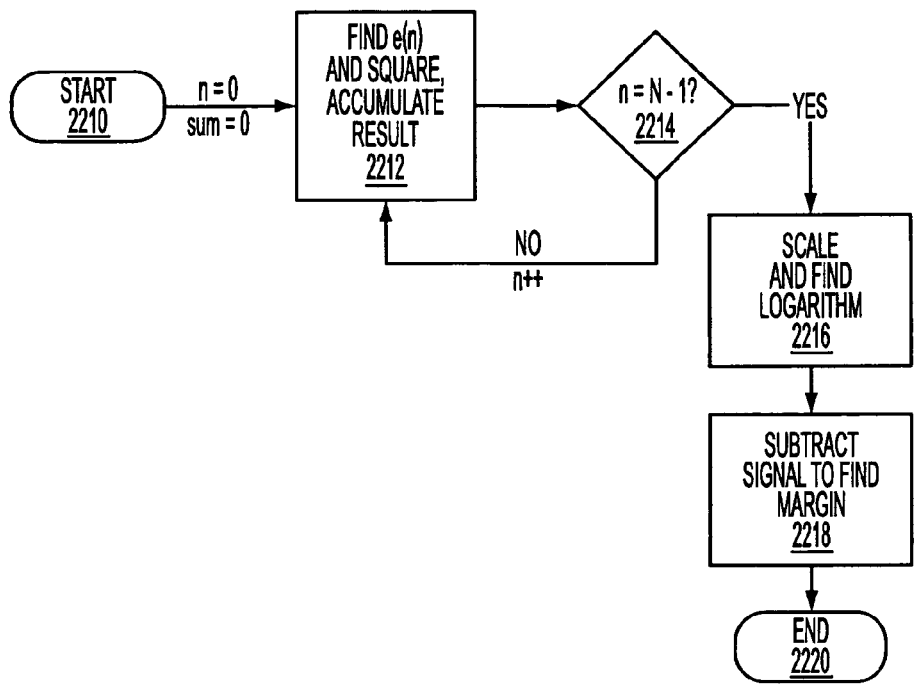
FIG. 22 illustrates a flowchart describing hardware algorithm for SNR margin, according to an embodiment of the present invention.

FIG. 22 illustrates a flowchart describing a hardware algorithm for SNR margin, according to an embodiment of the present invention. At step 2210, a start of a hardware algorithm for SNR margin may be initiated. Variables, such as n and sum may be initialized. At step 2212, an error signal, the square of the error signal and an accumulated result may be determined. At step 2214, it may be determined whether n=N−1 wherein N may be a summation length. If not, variable n may be adjusted by a predetermined value (as shown by n++) where step 2212 may be invoked. Otherwise, a logarithm may be determined and further scaled, at step 2216. At step 2218, the margin may be determined by subtracting a signal. Step 2220 indicates the end of the algorithm.-

An input to the hardware algorithm may include summation length, N. This number may be a power of 2 and may range from approximately 64 to approximately 32768. Summation length may be input as $\log_2(N)$. Other inputs may include constellation type, $10\log_{10}(P_s)$ and $SNR_{min}$, which represents a minimum SNR to obtain a specific BER, for example. Storage factors may include $\log_2(N_{max})+22=15+22=37$ bit accumulator to store the power sum. This accumulator may be cleared to zero every time a new average is started. Other storage factors may include K+1, where K represents the delay from a Trellis decoder input to output, samples of the input signal, 12-bits each, for example. The output may include SNR margin, which may include five integer bits. This means that a maximum value this output may have is approximately 31 dB. This may be compared to a threshold of 0–15 dB to determine if the margin is too small. The 16-bit SNR value may be subtracted from the reference, which may also be 16 bits. The value may then be rounded and the lower 5 integer bits compared to the threshold.

Figure 23:
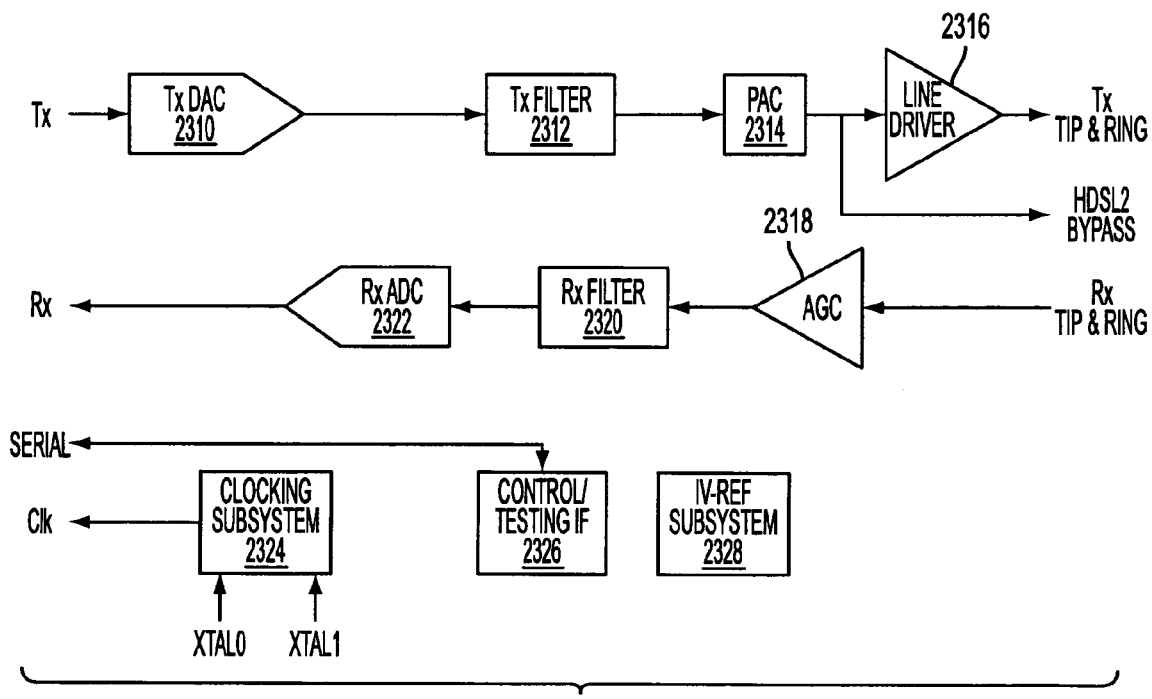
FIG. 23 is a schematic diagram of a hardware architecture in which the inventive aspects of the present invention may be incorporated.

FIG. 23 is a schematic diagram of a hardware architecture which may function with devices supporting certain inventive aspects of the present invention. AFE, such as the Aluminum™ 200 AFE, is a G.SHDSL/HDSL2/2B1Q SDS1 compliant Analog Front End (AFE) with integrated line driver designed to be used with GlobespanVirata's Aluminum™ 200 or 204 Symmetric DSL Processor to an external 2/4 wire hybrid.

The Aluminum™ 200 AFE conforms to G.shdsl PSD masks for every rate when interfaced to the Aluminum™ 200 or 204 DSL Processor, Aluminum™ 200 AFE also conforms to the HDSL2 OPTIS PSD mask at 1.544 Mbps. Aluminum™ 200 AFE may be used in a central office or remote application mode, selectable by configuring the programmable filters in the Aluminum™ 200 or 204 DSL Processor.

The Aluminum™ 200 AFE may include a high resolution 16-bit TX Digital Analog Converter (DAC) in the transmit path and one high resolution 16-bit RX Analog Digital Converter (ADC) in the receive path. A 10-bit DAC for the VCXO control is also integrated in the Aluminum™ 200 AFE to reduce the number of required external components. The transmitter programmable attenuation control (PAC) and the receiver programmable gain amplifier (PGA) may be programmed via the Aluminum™ 200 or 204 processor through a two-wire serial bus.

Aluminum™ 200 AFE has a low total power consumption of less than 800 mWatt (including the line drive) in full operation mode. An external line driver may also be used for HDSL2 and asymmetric PSD applications. Aluminum™ 200 AFE may also provide a power down mode for stand-by operation.

Product applications may include symmetric DSL routers and integrated access devices; DSL access multiplexers (DSLAMs); multi-tenant and multi-dwelling unit networks; T1/E1 distribution products; and T1/E1 pairgain systems (using proprietary 3 Mbps and higher data rates). Specification details may include ITU G.991.2 (G.shdsl) compliant; T1E1.4 HDSL2 compliant; ETSI ETR-152 compliant (single pair); and support for data rates from 192 Kbps to 2.312 Mbps and 8 Kbps increments, plus three additional rates of 3.096 Mbps, 4.104 Mbps and 4.616 Mbps.

As shown in FIG. 23, a transmission line may include a Tx Digital Audio Video (DAV) 2310 coupled to a Tx Filter 2312, further coupled to a Programmable Attenuation Control (PAC) 2314. PAC 2314 is coupled to a Line Driver 2316, which is coupled to a Tx Tip & Ring. PAC 2314 may be further coupled to a HDSL2 bypass. A receiving line includes Automatic Gain Control (AGC) 2318 coupled to Rx Tip & Ring at an input and Rx Filter 2320 at an output. Rx Filter 2320 is coupled to Rx ADC 2322. A control/testing interface 2326 may be provided on a serial line. A clocking subsystem 2324 may receive a plurality of inputs. The hardware architecture of FIG. 23 may further include a Current and Voltage Reference Generator (IV-REF) Subsystem 2328.

While the foregoing description includes many details and specificities, it is to be understood that these have been included for purposes of explanation only, and are not to be interpreted as limitations of the present invention. Many modifications to the embodiments described above can be made without departing from the spirit and scope of the invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. An algorithm for computing static pre-equalizer coefficients, the algorithm comprising the steps of:
   determining a length of algorithm iterations;
   calculating a feedforward coefficient vector associated with a feedforward equalizer;
   calculating a pre-equalizer coefficient vector associated with a pre-equalizer filter; and
   performing the steps of calculating for the length of the algorithm iterations; wherein a mean square of an error between an output sequence and a transmitted digital input sequence is minimized.

2. The algorithm of claim 1, wherein the feedforward equalizer is adaptive.

3. The algorithm of claim 1, wherein the pre-equalizer filter is non-adaptive.

4. The algorithm of claim 1, wherein the pre-equalizer coefficient vector comprises even-indexed pre-equalizer filter coefficients $\{p_{e,l}, l \in \{0, \ldots, N_P-1\}\}$ where $$p_{e,l}=p_{2l} l \in \{0, \ldots, N_P-1\}$$

where $N_P$ represents half a pre-equalizer length.

5. The algorithm of claim 4, wherein the pre-equalizer coefficient vector comprises odd-indexed pre-equalizer filter coefficients $\{p_{o,l}, l \in \{0, \ldots, N_P-1\}\}$ where $$p_{o,l}=p_{2l+1} l \in \{0, \ldots, N_P-1\}.$$

6. The algorithm of claim 1, wherein the feedforward coefficient vector comprises even feedforward filter coefficients in the $i^{th}$ test case, where $$f_{e,k}^{(i)}=f_{2k}^{(i)} k \in \{0, \ldots, N_F-1\}$$

where $N_F$ represents half a feedforward equalizer length.

7. The algorithm of claim 6, wherein the feedforward coefficient vector comprises odd feedforward filter coefficients in the $i^{th}$ test case, where $$f_{o,k}^{(i)} = f_{2k+1}^{(i)} k \in \{0, \ldots, N_F - 1\}.$$

8. The algorithm of claim 1, wherein the step of calculating a feedforward coefficient vector further comprises calculating a convolution matrix for a noise shaping filter.

9. The algorithm of claim 1, wherein the pre-equalizer filter increases an effective equalizer length without increasing a number of taps to be trained.

10. The algorithm of claim 1, wherein the pre-equalizer filter receives an input sequence comprising a combination of a noise sequence from a noise shaping filter and an output of a channel.

11. The algorithm of claim 10, wherein the channel models a linear distortion.

12. The algorithm of claim 10, wherein the channel models a linear time invariant filter.

13. The algorithm of claim 1, wherein the input sequence is received at an upsampling block for generating an upsampled signal.

14. The algorithm of claim 13, wherein the upsampled signal is received by a channel for generating a channel output and wherein the channel output is combined with a noise sequence for being received by the pre-equalizer filter.

15. The algorithm of claim 1, wherein the output sequence is produced by a feedback equalizer.

16. The algorithm of claim 15, wherein the feedback equalizer filter is adaptive.

17. The algorithm of claim 15, wherein the feedback equalizer filter processes at least one previous decision generated by a decision unit.

18. The algorithm of claim 15, wherein the output sequence is generated in part by a downsampled output of the feedforward equalizer.

* * * * *